(12) United States Patent
Venkatesh

(10) Patent No.: US 11,615,319 B2
(45) Date of Patent: Mar. 28, 2023

(54) SYSTEM AND METHOD FOR SHIFT-BASED INFORMATION MIXING ACROSS CHANNELS FOR SHUFFLENET-LIKE NEURAL NETWORKS

(71) Applicant: Meta Platforms Technologies, LLC, Menlo Park, CA (US)

(72) Inventor: Ganesh Venkatesh, San Jose, CA (US)

(73) Assignee: Meta Platforms Technologies, LLC, Menlo Park, CA (US)

(*) Notice: Subject to any disclaimer, the term of this patent is extended or adjusted under 35 U.S.C. 154(b) by 834 days.

(21) Appl. No.: 16/511,704

(22) Filed: Jul. 15, 2019

(65) Prior Publication Data

US 2021/0019633 A1    Jan. 21, 2021

(51) Int. Cl.
*G06N 3/00*  (2006.01)
*G06N 3/10*  (2006.01)
*G06F 5/01*  (2006.01)
*G06N 3/04*  (2023.01)
*G06N 3/08*  (2023.01)

(52) U.S. Cl.
CPC ............... *G06N 3/10* (2013.01); *G06F 5/01* (2013.01); *G06N 3/04* (2013.01); *G06N 3/08* (2013.01)

(58) Field of Classification Search
None
See application file for complete search history.

(56) References Cited

U.S. PATENT DOCUMENTS

2018/0181858 A1\* 6/2018 Son .................. G06N 3/0445

OTHER PUBLICATIONS

He Y., et al., "AddressNet: Shift-Based Primitives for Efficient Convolutional Neural Networks," IEEE Winter Conference on Applications of Computer Vision(WACV), IEEE, Jan. 7, 2019, pp. 1213-1222, XP033525718.
International Search Report and Written Opinion for International Application No. PCT/US2020/041451, dated Nov. 5, 2020, 07 Pages.
Xiangyu Zhang, et al., "ShuffleNet: An Extremely Efficient Convolutional Neural Network for Mobile Devices," 2018 IEEE/CVF Conference on Computer Vision and Pattern Recognition, Jun. 18-23, 2018, pp. 6848-6856, DOI: 10.1109/CVPR.2018.00716.
Xiangyu Zhang, et al., "Shufflenet: An extremely efficient convolutional neural network for mobile devices," arXiv preprint arXiv:1707. 01083, Dec. 7, 2017.

\* cited by examiner

*Primary Examiner* — Martin Mushambo
(74) *Attorney, Agent, or Firm* — Foley & Lardner LLP

(57) ABSTRACT

Disclosed herein includes a system, a method, and a device for performing a convolution on data of a current layer of a neural network, including a plurality of channels arranged in a first order and partitioned into a plurality of first partitions according to the first order. Each first partition includes a result of a convolution on a corresponding partition of channels in data of a previous layer of the neural network. The device shifts the plurality of channels arranged in the first order to a second order, partition the shifted plurality of channels into a plurality of second partitions, according to the second order. For each of the plurality of second partitions, the device performs a convolution on channels of the shifted plurality of channels that are in the corresponding second partition.

17 Claims, 9 Drawing Sheets

SYSTEM AND METHOD FOR SHIFT-BASED INFORMATION MIXING ACROSS CHANNELS FOR SHUFFLENET-LIKE NEURAL NETWORKS

FIELD OF DISCLOSURE

The present disclosure is generally related to a system and method for performing a convolution, including but not limited to, a system and method for performing a convolution on shifted channels.

BACKGROUND

One challenge in artificial intelligence (AI) accelerators relates to controlling or reducing power consumption in performing AI processing for a neural network. For example, the neural network may be a convolutional neural network which can include convolution layers. In a convolution layer, an AI accelerator can apply a convolution operation to an input layer, passing the result to the next layer in a manner that reduces the number of parameters compared to conventional fully connected feedforward neural network. However, as more and more complex multi-dimensional (e.g., multiple channels) input/output structures are used in a convolutional neural network, ways to reduce energy and latency may be beneficial. Moreover, in view of excessive memory operations in applying information mixing to a convolution operation, reducing memory operations may be beneficial.

SUMMARY

Various embodiments disclosed herein are related to a device for performing a convolution on channels of a plurality of channels that are in a corresponding partition among a plurality of partitions. In some embodiments, the device may include a memory and circuitry. The memory may be configured to store data of a current layer of a neural network. The data may include a plurality of channels arranged in a first order and partitioned into a plurality of first partitions according to the first order. A channel of the plurality of channels may be an array of data having at least one dimension. Each first partition may include a result of a convolution on a corresponding partition of channels in data of a previous layer of the neural network. The circuitry may be configured to shift the plurality of channels arranged in the first order to a second order. The circuitry may be configured to partition the shifted plurality of channels into a plurality of second partitions, according to the second order. For each of the plurality of second partitions, the circuitry may be configured to perform a convolution on channels of the shifted plurality of channels that are in the corresponding second partition.

In some embodiments, the circuitry may be configured to circularly shift the plurality of channels arranged in the first order to the second order by a determined number of channels. In some embodiments, the circuitry may be further configured to write the plurality of channels arranged in the second order, to a continuous range of addresses of the memory. The circuitry may be further configured to read the plurality of channels arranged in the second order, from the continuous range of addresses of the memory.

In some embodiments, each of the plurality of channels may have a corresponding identifier. The circuitry may be configured to identify a memory address of a particular channel of the plurality of channels by applying an address mapping function to an identifier corresponding to the particular channel. The circuitry may be configured to read the particular channel from the identified address of the particular channel in the memory. In some embodiments, a number of the plurality of second partitions may be the same as that of the plurality of first partitions. Each of the plurality of second partitions may have at least one channel common with a corresponding one of the plurality of first partitions.

In some embodiments, the circuitry may include shift circuitry configured to circularly shift the plurality of channels arranged in the first order. The circuitry may include multiplier and accumulator (MAC) circuitry configured to perform, for each of the plurality of second partitions, the convolution on channels of the circularly shifted plurality of channels that are in the corresponding second partition. The shift circuitry may be configured to circularly shift the plurality of channels arranged in the first order in one of a right direction or a left direction.

Various embodiments disclosed herein are related to a method for performing a convolution on channels of a plurality of channels that are in a corresponding partition among a plurality of partitions. In some embodiments, the method includes storing, in a memory, data of a current layer of a neural network. The data may include a plurality of channels arranged in a first order and partitioned into a plurality of first partitions according to the first order. Each first partition may include a result of a convolution on a corresponding partition of channels in data of a previous layer of the neural network. According to the method, the plurality of channels arranged in the first order may be shifted by circuitry, to a second order. The shifted plurality of channels may be partitioned by the circuitry into a plurality of second partitions, according to the second order. For each of the plurality of second partitions, a convolution on channels of the shifted plurality of channels that are in the corresponding second partition, may be performed by the circuitry.

In some embodiments, a channel of the plurality of channels may include an array of data having at least one dimension. In some embodiments, the plurality of channels arranged in the first order may be circularly shifted to the second order by a determined number of channels. In some embodiments, the plurality of channels arranged in the first order may be circularly shifted by shift circuitry. In some embodiments, the plurality of channels arranged in the first order may be circularly shifted by the shift circuitry in one of a right direction or a left direction.

In some embodiments, the plurality of channels arranged in the second order may be written to a continuous range of addresses of the memory. In some embodiments, the plurality of channels arranged in the second order may be read from the continuous range of addresses of the memory. In some embodiments, a number of the plurality of second partitions may be the same as that of the plurality of first partitions. Each of the plurality of second partitions may have at least one channel common with a corresponding one of the plurality of first partitions.

In some embodiments, each of the plurality of channels may have a corresponding identifier. In some embodiments, a memory address of a particular channel of the plurality of channels may be identified by applying an address mapping function to an identifier corresponding to the particular channel. The particular channel may be read from the identified address of the particular channel in the memory. In some embodiments, for each of the plurality of second partitions, the convolution on channels of the circularly shifted plurality of channels that are in the corresponding second partition may be performed by multiplier and accumulator (MAC) circuitry.

These and other aspects and implementations are discussed in detail below. The foregoing information and the following detailed description include illustrative examples of various aspects and implementations, and provide an overview or framework for understanding the nature and character of the claimed aspects and implementations. The drawings provide illustration and a further understanding of the various aspects and implementations, and are incorporated in and constitute a part of this specification.

BRIEF DESCRIPTION OF THE DRAWINGS

The accompanying drawings are not intended to be drawn to scale. Like reference numbers and designations in the various drawings indicate like elements. For purposes of clarity, not every component can be labeled in every drawing.

DETAILED DESCRIPTION

Before turning to the figures, which illustrate certain embodiments in detail, it should be understood that the present disclosure is not limited to the details or methodology set forth in the description or illustrated in the figures. It should also be understood that the terminology used herein is for the purpose of description only and should not be regarded as limiting.

For purposes of reading the description of the various embodiments of the present invention below, the following descriptions of the sections of the specification and their respective contents may be helpful:

Section A describes an environment, system, configuration and/or other aspects useful for practicing or implementing an embodiment of the present systems, methods and devices; and Section B describes embodiments of devices, systems and methods for performing a convolution on channels.

A. Environment for Artificial Intelligence Related Processing

Figure 1A:
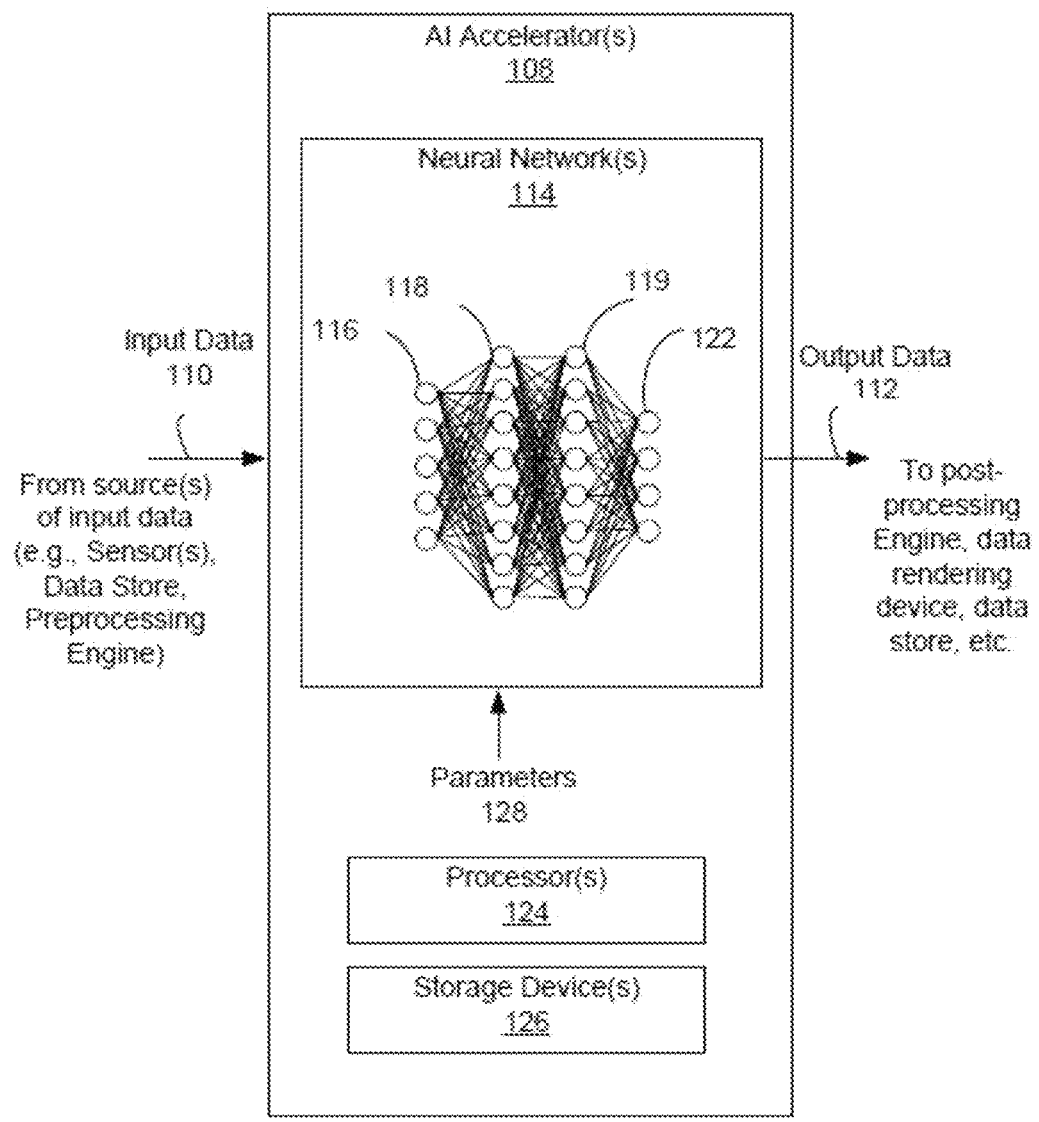
FIG. 1A is a block diagram of an embodiment of a system for performing artificial intelligence (AI) related processing, according to an example implementation of the present disclosure.

Prior to discussing the specifics of embodiments of systems, devices and/or methods in Section B, it may be helpful to discuss the environments, systems, configurations and/or other aspects useful for practicing or implementing certain embodiments of the systems, devices and/or methods. Referring now to FIG. 1A, an embodiment of a system for performing artificial intelligence (AI) related processing is depicted. In brief overview, the system includes one or more AI accelerators 108 that can perform AI related processing using input data 110. Although referenced as an AI accelerator 108, it is sometimes referred as a neural network accelerator (NNA), neural network chip or hardware, AI processor, AI chip, etc. The AI accelerator(s) 108 can perform AI related processing to output or provide output data 112, according to the input data 110 and/or parameters 128 (e.g., weight and/or bias information). An AI accelerator 108 can include and/or implement one or more neural networks 114 (e.g., artificial neural networks), one or more processor(s) 24 and/or one or more storage devices 126.

Each of the above-mentioned elements or components is implemented in hardware, or a combination of hardware and software. For instance, each of these elements or components can include any application, program, library, script, task, service, process or any type and form of executable instructions executing on hardware such as circuitry that can include digital and/or analog elements (e.g., one or more transistors, logic gates, registers, memory devices, resistive elements, conductive elements, capacitive elements).

The input data 110 can include any type or form of data for configuring, tuning, training and/or activating a neural network 114 of the AI accelerator(s) 108, and/or for processing by the processor(s) 124. The neural network 114 is sometimes referred to as an artificial neural network (ANN). Configuring, tuning and/or training a neural network can refer to or include a process of machine learning in which training data sets (e.g., as the input data 110) such as historical data are provided to the neural network for processing. Tuning or configuring can refer to or include training or processing of the neural network 114 to allow the neural network to improve accuracy. Tuning or configuring the neural network 114 can include, for example, designing, forming, building, synthesizing and/or establishing the neural network using architectures that have proven to be successful for the type of problem or objective desired for the neural network 114. In some cases, the one or more neural networks 114 may initiate at a same or similar baseline model, but during the tuning, training or learning process, the results of the neural networks 114 can be sufficiently different such that each neural network 114 can be tuned to process a specific type of input and generate a specific type of output with a higher level of accuracy and reliability as compared to a different neural network that is either at the baseline model or tuned or trained for a different objective or purpose. Tuning the neural network 114 can include setting different parameters 128 for each neural network 114, fine-tuning the parameters 114 differently for each neural network 114, or assigning different weights (e.g., hyperparameters, or learning rates), tensor flows, etc. Thus, setting appropriate parameters 128 for the neural network(s) 114 based on a tuning or training process and the objective of the neural network(s) and/or the system, can improve performance of the overall system.

A neural network 114 of the AI accelerator 108 can include any type of neural network including, for example, a convolution neural network (CNN), deep convolution network, a feed forward neural network (e.g., multilayer perceptron (MLP)), a deep feed forward neural network, a radial basis function neural network, a Kohonen self-organizing neural network, a recurrent neural network, a modular neural network, a long/short term memory neural network, etc. The neural network(s) 114 can be deployed or used to perform data (e.g., image, audio, video) processing, object or feature recognition, recommender functions, data or image classification, data (e.g., image) analysis, etc., such as natural language processing.

As an example, and in one or more embodiments, the neural network 114 can be configured as or include a convolution neural network. The convolution neural network can include one or more convolution cells (or pooling layers) and kernels, that can each serve a different purpose. The convolution neural network can include, incorporate and/or use a convolution kernel (sometimes simply referred as "kernel"). The convolution kernel can process input data, and the pooling layers can simplify the data, using, for example, non-linear functions such as a max, thereby reducing unnecessary features. The neural network 114 including the convolution neural network can facilitate image, audio or any data recognition or other processing. For example, the input data 110 (e.g., from a sensor) can be passed to convolution layers of the convolution neural network that form a funnel, compressing detected features in the input data 110. The first layer of the convolution neural network can detect first characteristics, the second layer can detect second characteristics, and so on.

The convolution neural network can be a type of deep, feed-forward artificial neural network configured to analyze visual imagery, audio information, and/or any other type or form of input data 110. The convolution neural network can include multilayer perceptrons designed to use minimal preprocessing. The convolution neural network can include or be referred to as shift invariant or space invariant artificial neural networks, based on their shared-weights architecture and translation invariance characteristics. Since convolution neural networks can use relatively less pre-processing compared to other data classification/processing algorithms, the convolution neural network can automatically learn the filters that may be hand-engineered for other data classification/processing algorithms, thereby improving the efficiency associated with configuring, establishing or setting up the neural network 114, thereby providing a technical advantage relative to other data classification/processing techniques.

The neural network 114 can include an input layer 116 and an output layer 122, of neurons or nodes. The neural network 114 can also have one or more hidden layers 118, 119 that can include convolution layers, pooling layers, fully connected layers, and/or normalization layers, of neurons or nodes. In a neural network 114, each neuron can receive input from some number of locations in the previous layer. In a fully connected layer, each neuron can receive input from every element of the previous layer.

Each neuron in a neural network 114 can compute an output value by applying some function to the input values coming from the receptive field in the previous layer. The function that is applied to the input values is specified by a vector of weights and a bias (typically real numbers). Learning (e.g., during a training phase) in a neural network 114 can progress by making incremental adjustments to the biases and/or weights. The vector of weights and the bias can be called a filter and can represent some feature of the input (e.g., a particular shape). A distinguishing feature of convolutional neural networks is that many neurons can share the same filter. This reduces memory footprint because a single bias and a single vector of weights can be used across all receptive fields sharing that filter, rather than each receptive field having its own bias and vector of weights.

For example, in a convolution layer, the system can apply a convolution operation to the input layer 116, passing the result to the next layer. The convolution emulates the response of an individual neuron to input stimuli. Each convolutional neuron can process data only for its receptive field. Using the convolution operation can reduce the number of neurons used in the neural network 114 as compared to a fully connected feedforward neural network. Thus, the convolution operation can reduce the number of free parameters, allowing the network to be deeper with fewer parameters. For example, regardless of an input data (e.g., image data) size, tiling regions of size 5×5, each with the same shared weights, may use only 25 learnable parameters. In this way, the first neural network 114 with a convolution neural network can resolve the vanishing or exploding gradients problem in training traditional multi-layer neural networks with many layers by using backpropagation.

The neural network 114 (e.g., configured with a convolution neural network) can include one or more pooling layers. The one or more pooling layers can include local pooling layers or global pooling layers. The pooling layers can combine the outputs of neuron clusters at one layer into a single neuron in the next layer. For example, max pooling can use the maximum value from each of a cluster of neurons at the prior layer. Another example is average pooling, which can use the average value from each of a cluster of neurons at the prior layer.

The neural network 114 (e.g., configured with a convolution neural network) can include fully connected layers. Fully connected layers can connect every neuron in one layer to every neuron in another layer. The neural network 114 can be configured with shared weights in convolutional layers, which can refer to the same filter being used for each receptive field in the layer, thereby reducing a memory footprint and improving performance of the first neural network 114.

The hidden layers 118, 119 can include filters that are tuned or configured to detect information based on the input data (e.g., sensor data, from a virtual reality system for instance). As the system steps through each layer in the neural network 114 (e.g., convolution neural network), the system can translate the input from a first layer and output the transformed input to a second layer, and so on. The neural network 114 can include one or more hidden layers 118, 119 based on the type of object or information being detected, processed and/or computed, and the type of input data 110.

In some embodiments, the convolutional layer is the core building block of a neural network 114 (e.g., configured as a CNN). The layer's parameters 128 can include a set of learnable filters (or kernels), which have a small receptive field, but extend through the full depth of the input volume. During the forward pass, each filter is convolved across the width and height of the input volume, computing the dot product between the entries of the filter and the input and producing a 2-dimensional activation map of that filter. As a result, the neural network 114 can learn filters that activate when it detects some specific type of feature at some spatial position in the input. Stacking the activation maps for all filters along the depth dimension forms the full output volume of the convolution layer. Every entry in the output volume can thus also be interpreted as an output of a neuron that looks at a small region in the input and shares parameters with neurons in the same activation map. In a convolutional layer, neurons can receive input from a restricted subarea of the previous layer. Typically, the subarea is of a square shape (e.g., size 5 by 5). The input area of a neuron is called its receptive field. So, in a fully connected layer, the receptive field is the entire previous layer. In a convolutional layer, the receptive area can be smaller than the entire previous layer.

The first neural network 114 can be trained to detect, classify, segment and/or translate input data 110 (e.g., by detecting or determining the probabilities of objects, events, words and/or other features, based on the input data 110). For example, the first input layer 116 of neural network 114 can receive the input data 110, process the input data 110 to transform the data to a first intermediate output, and forward the first intermediate output to a first hidden layer 118. The first hidden layer 118 can receive the first intermediate output, process the first intermediate output to transform the first intermediate output to a second intermediate output, and forward the second intermediate output to a second hidden layer 119. The second hidden layer 119 can receive the second intermediate output, process the second intermediate output to transform the second intermediate output to a third intermediate output, and forward the third intermediate output to an output layer 122 for example. The output layer 122 can receive the third intermediate output, process the third intermediate output to transform the third intermediate output to output data 112, and forward the output data 112 (e.g., possibly to a post-processing engine, for rendering to a user, for storage, and so on). The output data 112 can include object detection data, enhanced/translated/augmented data, a recommendation, a classification, and/or segmented data, as examples.

Referring again to FIG. 1A, the AI accelerator 108 can include one or more storage devices 126. A storage device 126 can be designed or implemented to store, hold or maintain any type or form of data associated with the AI accelerator(s) 108. For example, the data can include the input data 110 that is received by the AI accelerator(s) 108, and/or the output data 112 (e.g., before being output to a next device or processing stage). The data can include intermediate data used for, or from any of the processing stages of a neural network(s) 114 and/or the processor(s) 124. The data can include one or more operands for input to and processing at a neuron of the neural network(s) 114, which can be read or accessed from the storage device 126. For example, the data can include input data, weight information and/or bias information, activation function information, and/or parameters 128 for one or more neurons (or nodes) and/or layers of the neural network(s) 114, which can be stored in and read or accessed from the storage device 126. The data can include output data from a neuron of the neural network(s) 114, which can be written to and stored at the storage device 126. For example, the data can include activation data, refined or updated data (e.g., weight information and/or bias information from a training phase for example, activation function information, and/or other parameters 128) for one or more neurons (or nodes) and/or layers of the neural network(s) 114, which can be transferred or written to, and stored in the storage device 126.

In some embodiments, the AI accelerator 108 can include one or more processors 124. The one or more processors 124 can include any logic, circuitry and/or processing component (e.g., a microprocessor) for pre-processing input data for any one or more of the neural network(s) 114 or AI accelerator(s) 108, and/or for post-processing output data for any one or more of the neural network(s) 114 or AI accelerator(s) 108. The one or more processors 124 can provide logic, circuitry, processing component and/or functionality for configuring, controlling and/or managing one or more operations of the neural network(s) 114 or AI accelerator(s) 108. For instance, a processor 124 may receive data or signals associated with a neural network 114 to control or reduce power consumption (e.g., via clock-gating controls on circuitry implementing operations of the neural network 114). As another example, a processor 124 may partition and/or re-arrange data for separate processing (e.g., at various components of an AI accelerator 108, in parallel for example), sequential processing (e.g., on the same component of an AI accelerator 108, at different times or stages), or for storage in different memory slices of a storage device, or in different storage devices. In some embodiments, the processor(s) 124 can configure a neural network 114 to operate for a particular context, provide a certain type of processing, and/or to address a specific type of input data, e.g., by identifying, selecting and/or loading specific weight, activation function and/or parameter information to neurons and/or layers of the neural network 114.

In some embodiments, the AI accelerator 108 is designed and/or implemented to handle or process deep learning and/or AI workloads. For example, the AI accelerator 108 can provide hardware acceleration for artificial intelligence applications, including artificial neural networks, machine vision and machine learning. The AI accelerator 108 can be configured for operation to handle robotics related, internet of things (IoT) related, and other data-intensive or sensor-driven tasks. The AI accelerator 108 may include a multi-core or multiple processing element (PE) design, and can be incorporated into various types and forms of devices such as artificial reality (e.g., virtual, augmented or mixed reality) systems, smartphones, tablets, and computers. Certain embodiments of the AI accelerator 108 can include or be implemented using at least one digital signal processor (DSP), co-processor, microprocessor, computer system, heterogeneous computing configuration of processors, graphics processing unit (GPU), field-programmable gate array (FPGA), and/or application-specific integrated circuit (ASIC). The AI accelerator 108 can be a transistor based, semiconductor based and/or a quantum computing based device.

Figure 1B:
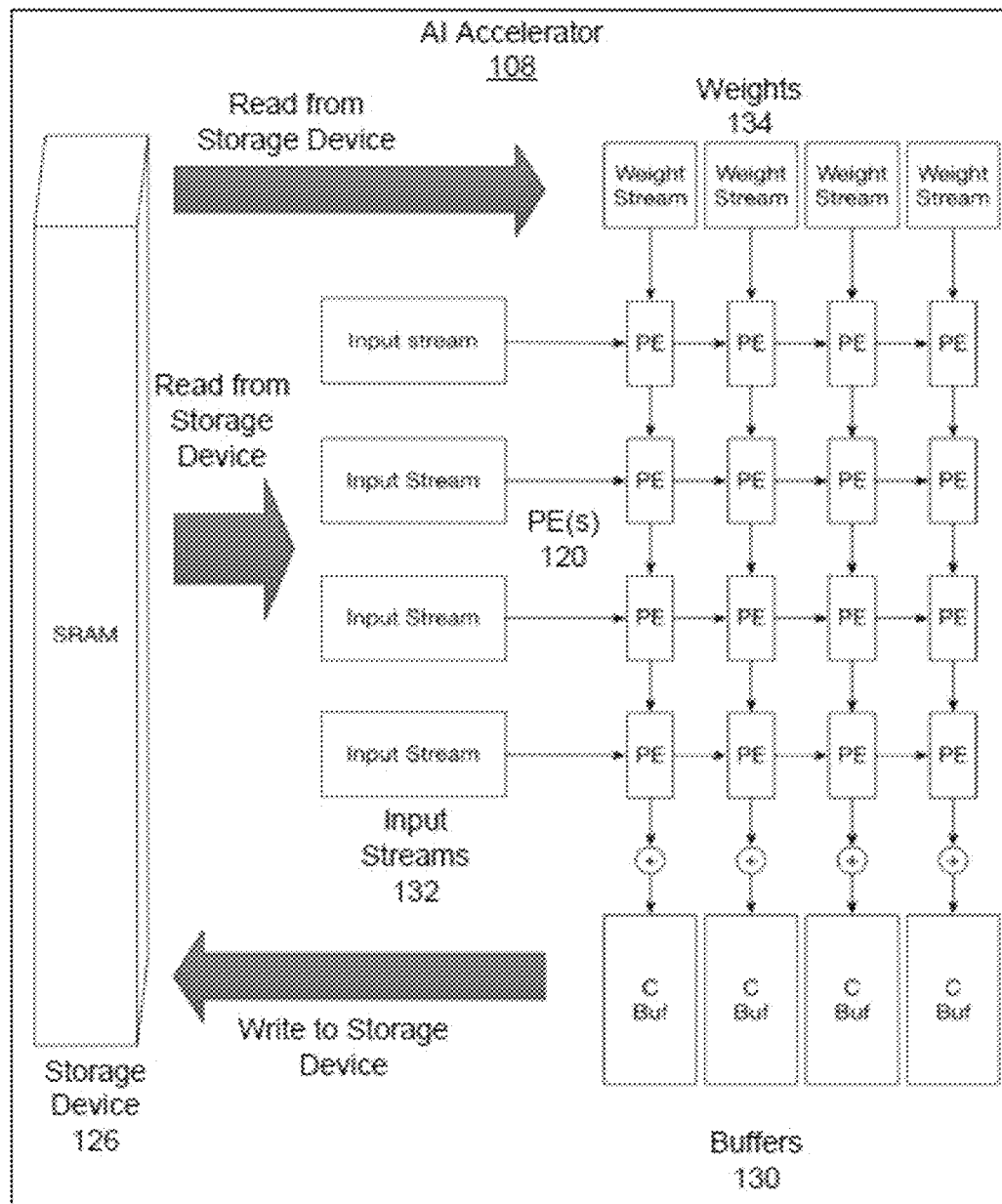
FIG. 1B is a block diagrams of an embodiment of a device for performing AI related processing, according to an example implementation of the present disclosure.

Referring now to FIG. 1B, an example embodiment of a device for performing AI related processing is depicted. In brief overview, the device can include or correspond to an AI accelerator 108, e.g., with one or more features described above in connection with FIG. 1A. The AI accelerator 108 can include one or more storage devices 126 (e.g., memory such as a static random-access memory (SRAM) device), one or more buffers, a plurality or array of processing element (PE) circuits, other logic or circuitry (e.g., adder circuitry), and/or other structures or constructs (e.g., interconnects, data buses, clock circuitry, power network(s)). Each of the above-mentioned elements or components is implemented in hardware, or at least a combination of hardware and software. The hardware can for instance include circuit elements (e.g., one or more transistors, logic gates, registers, memory devices, resistive elements, conductive elements, capacitive elements, and/or wire or electrically conductive connectors).

In a neural network 114 (e.g., artificial neural network) implemented in the AI accelerator 108, neurons can take various forms and can be referred to as processing elements (PEs) or PE circuits. The neuron can be implemented as a corresponding PE circuit, and the processing/activation that can occur at the neuron can be performed at the PE circuit. The PEs are connected into a particular network pattern or array, with different patterns serving different functional purposes. The PE in an artificial neural network operate electrically (e.g., in the embodiment of a semiconductor implementation), and may be either analog, digital, or a hybrid. To parallel the effect of a biological synapse, the connections between PEs can be assigned multiplicative weights, which can be calibrated or "trained" to produce the proper system output.

A PE can be defined in terms of the following equations (e.g., which represent a McCulloch-Pitts model of a neuron):

$$\zeta = \Sigma_i w_i x_i \tag{1}$$

$$y = \sigma(\zeta) \tag{2}$$

Where $\zeta$ is the weighted sum of the inputs (e.g., the inner product of the input vector and the tap-weight vector), and $\sigma(\zeta)$ is a function of the weighted sum. Where the weight and input elements form vectors w and x, the $\zeta$ weighted sum becomes a simple dot product:

$$\zeta = w \cdot x \tag{3}$$

This may be referred to as either the activation function (e.g., in the case of a threshold comparison) or a transfer function. In some embodiments, one or more PEs can be referred to as a dot product engine. The input (e.g., input data 110) to the neural network 114, x, can come from an input space and the output (e.g., output data 112) are part of the output space. For some neural networks, the output space Y may be as simple as {0, 1}, or it may be a complex multi-dimensional (e.g., multiple channel) space (e.g., for a convolutional neural network). Neural networks tend to have one input per degree of freedom in the input space, and one output per degree of freedom in the output space.

In some embodiments, the PEs can be arranged and/or implemented as a systolic array. A systolic array can be a network (e.g., a homogeneous network) of coupled data processing units (DPUs) such as PEs, called cells or nodes. Each node or PE can independently compute a partial result as a function of the data received from its upstream neighbors, can store the result within itself and can pass the result downstream for instance. The systolic array can be hard-wired or software configured for a specific application. The nodes or PEs can be fixed and identical, and interconnect of the systolic array can be programmable. Systolic arrays can rely on synchronous data transfers.

Referring again to FIG. 1B, the input x to a PE 120 can be part of an input stream 132 that is read or accessed from a storage device 126 (e.g., SRAM). An input stream 132 can be directed to one row (horizontal bank or group) of PEs, and can be shared across one or more of the PEs, or partitioned into data portions (overlapping or non-overlapping data portions) as inputs for respective PEs. Weights 134 (or weight information) in a weight stream (e.g., read from the storage device 126) can be directed or provided to a column (vertical bank or group) of PEs. Each of the PEs in the column may share the same weight 134 or receive a corresponding weight 134. The input and/or weight for each target PE can be directly routed (e.g., from the storage device 126) to the target PE (e.g., without passing through other PE(s)), or can be routed through one or more PEs (e.g., along a row or column of PEs) to the target PE. The output of each PE can be routed directly out of the PE array (e.g., without passing through other PE(s)), or can be routed through one or more PEs (e.g., along a column of PEs) to exit the PE array. The outputs of each column of PEs can be summed or added at an adder circuitry of the respective column, and provided to a buffer 130 for the respective column of PEs. The buffer(s) 130 can provide, transfer, route, write and/or store the received outputs to the storage device 126. In some embodiments, the outputs (e.g., activation data from one layer of the neural network) that are stored by the storage device 126 can be retrieved or read from the storage device 126, and be used as inputs to the array of PEs 120 for processing (of a subsequent layer of the neural network) at a later time. In certain embodiments, the outputs that are stored by the storage device 126 can be retrieved or read from the storage device 126 as output data 112 for the AI accelerator 108.

Figure 1C:
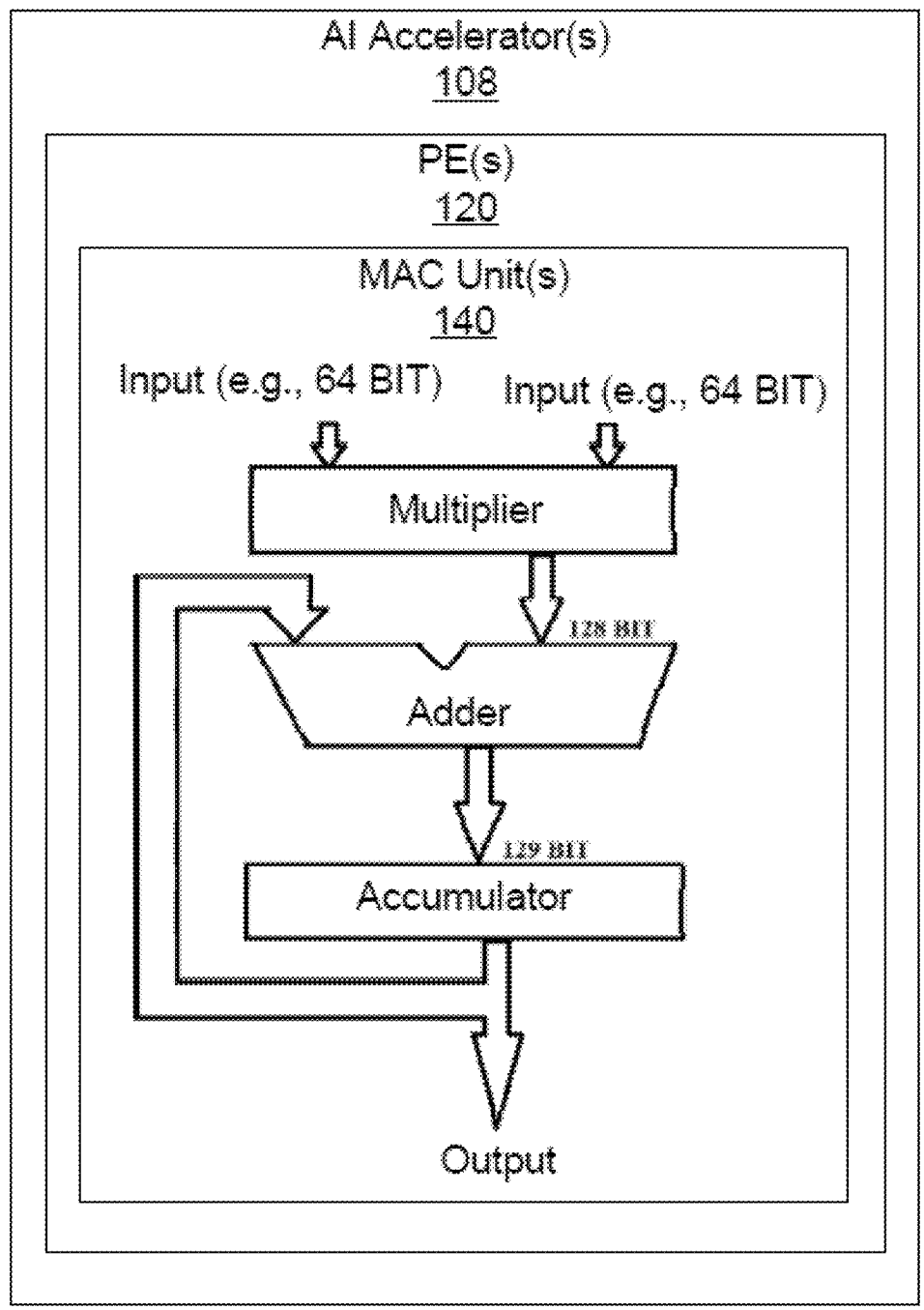
FIG. 1C is a block diagram of an embodiment of a device for performing AI related processing, according to an example implementation of the present disclosure.

Referring now to FIG. 1C, one example embodiment of a device for performing AI related processing is depicted. In brief overview, the device can include or correspond to an AI accelerator 108, e.g., with one or more features described above in connection with FIGS. 1A and 1B. The AI accelerator 108 can include one or more PEs 120, other logic or circuitry (e.g., adder circuitry), and/or other structures or constructs (e.g., interconnects, data buses, clock circuitry, power network(s)). Each of the above-mentioned elements or components is implemented in hardware, or at least a combination of hardware and software. The hardware can for instance include circuit elements (e.g., one or more transistors, logic gates, registers, memory devices, resistive elements, conductive elements, capacitive elements, and/or wire or electrically conductive connectors).

In some embodiments, a PE 120 can include one or more multiply-accumulate (MAC) units or circuits 140. One or more PEs can sometimes be referred to (singly or collectively) as a MAC engine. A MAC unit is configured to perform multiply-accumulate operation(s). The MAC unit can include a multiplier circuit, an adder circuit and/or an accumulator circuit. The multiply-accumulate operation computes the product of two numbers and adds that product to an accumulator. The MAC operation can be represented as follows, in connection with an accumulator operand a, and inputs b and c:

$$a \leftarrow a + (b \times c) \tag{4}$$

In some embodiments, a MAC unit 140 may include a multiplier implemented in combinational logic followed by an adder (e.g., that includes combinational logic) and an accumulator register (e.g., that includes sequential and/or combinational logic) that stores the result. The output of the accumulator register can be fed back to one input of the adder, so that on each clock cycle, the output of the multiplier can be added to the accumulator register.

As discussed above, a MAC unit 140 can perform both multiply and addition functions. The MAC unit 140 can operate in two stages. The MAC unit 140 can first compute the product of given numbers (inputs) in a first stage, and forward the result for the second stage operation (e.g., addition and/or accumulate). An n-bit MAC unit 140 can include an n-bit multiplier, 2n-bit adder, and 2n-bit accumulator. An array or plurality of MAC units 140 (e.g., in PEs) can be arranged in a systolic array, for parallel integration, convolution, correlation, matrix multiplication, data sorting, and/or data analysis tasks.

Figure 1D:
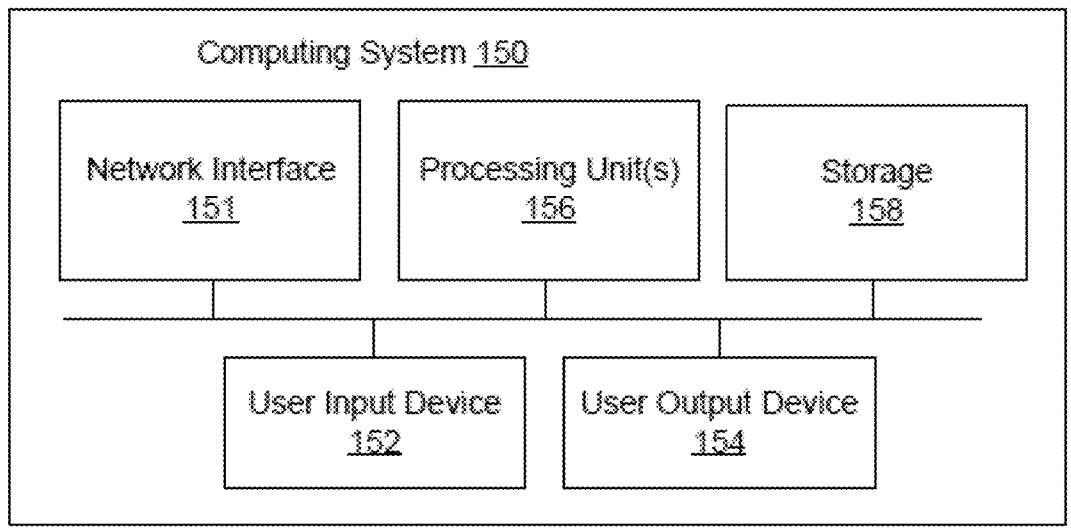
FIG. 1D is a block diagram of a computing environment according to an example implementation of the present disclosure.

Various systems and/or devices described herein can be implemented in a computing system. FIG. 1D shows a block diagram of a representative computing system 150. In some embodiments, the system of FIG. 1A can form at least part of the processing unit(s) 156 (or processors 156) of the computing system 150. Computing system 150 can be implemented, for example, as a device (e.g., consumer device) such as a smartphone, other mobile phone, tablet computer, wearable computing device (e.g., smart watch, eyeglasses, head mounted display), desktop computer, laptop computer, or implemented with distributed computing devices. The computing system 150 can be implemented to provide VR, AR, MR experience. In some embodiments, the computing system 150 can include conventional, specialized or custom computer components such as processors 156, storage device 158, network interface 151, user input device 152, and user output device 154.

Network interface 151 can provide a connection to a local/wide area network (e.g., the Internet) to which network interface of a (local/remote) server or back-end system is also connected. Network interface 151 can include a wired interface (e.g., Ethernet) and/or a wireless interface implementing various RF data communication standards such as Wi-Fi, Bluetooth, or cellular data network standards (e.g., 3G, 4G, 5G, LTE, etc.).

User input device 152 can include any device (or devices) via which a user can provide signals to computing system 150; computing system 150 can interpret the signals as indicative of particular user requests or information. User input device 152 can include any or all of a keyboard, touch pad, touch screen, mouse or other pointing device, scroll wheel, click wheel, dial, button, switch, keypad, microphone, sensors (e.g., a motion sensor, an eye tracking sensor, etc.), and so on.

User output device 154 can include any device via which computing system 150 can provide information to a user. For example, user output device 154 can include a display to display images generated by or delivered to computing system 150. The display can incorporate various image generation technologies, e.g., a liquid crystal display (LCD), light-emitting diode (LED) including organic light-emitting diodes (OLED), projection system, cathode ray tube (CRT), or the like, together with supporting electronics (e.g., digital-to-analog or analog-to-digital converters, signal processors, or the like). A device such as a touchscreen that function as both input and output device can be used. User output devices 154 can be provided in addition to or instead of a display. Examples include indicator lights, speakers, tactile "display" devices, printers, and so on.

Some implementations include electronic components, such as microprocessors, storage and memory that store computer program instructions in a non-transitory computer readable storage medium. Many of the features described in this specification can be implemented as processes that are specified as a set of program instructions encoded on a computer readable storage medium. When these program instructions are executed by one or more processors, they cause the processors to perform various operation indicated in the program instructions. Examples of program instructions or computer code include machine code, such as is produced by a compiler, and files including higher-level code that are executed by a computer, an electronic component, or a microprocessor using an interpreter. Through suitable programming, processor 156 can provide various functionality for computing system 150, including any of the functionality described herein as being performed by a server or client, or other functionality associated with message management services.

It will be appreciated that computing system 150 is illustrative and that variations and modifications are possible. Computer systems used in connection with the present disclosure can have other capabilities not specifically described here. Further, while computing system 150 is described with reference to particular blocks, it is to be understood that these blocks are defined for convenience of description and are not intended to imply a particular physical arrangement of component parts. For instance, different blocks can be located in the same facility, in the same server rack, or on the same motherboard. Further, the blocks need not correspond to physically distinct components. Blocks can be configured to perform various operations, e.g., by programming a processor or providing appropriate control circuitry, and various blocks might or might not be reconfigurable depending on how the initial configuration is obtained. Implementations of the present disclosure can be realized in a variety of apparatus including electronic devices implemented using any combination of circuitry and software.

B. Methods and Devices for Performing a Convolution on Channels

Disclosed herein include embodiments of a system, a method, and a device for performing a convolution on channels of a plurality of channels, e.g., that are in a corresponding partition among a plurality of partitions. In some aspects, a system and method is disclosed herein for performing a convolution on channels of a shifted plurality of channels that are in a corresponding second partition among a second plurality of partitions. In some aspects, this disclosure is directed to a technique for performing a channel shuffling operation with reduced memory accesses, for instance in a general matrix multiply (GEMM) accelerator. Channel shuffling can enable power savings by limiting or reducing the amount of processing to subsets of weight and/or activation information (instead of processing all information) of a neural network implemented in an AI chip. In one aspect, channel shuffling can be performed in element-wise manner with a number of flipflops and a small model size. However, element-wise channel shuffling is not hardware-friendly and leads to extra memory accesses to implement. The disclosure provides a solution to replace the element-wise channel shuffle with a vector-based rotation so that no extra memory passes are needed for the shuffle operation. In some embodiments, the AI accelerator can rotate values (e.g., of an output) of a convolution operation by writing consecutive X bytes of the values to neighboring entries for instance, where X is an integer. These writing operations can be performed in bulk, thereby reducing SRAM write cost compared to storing the values sequentially.

Group convolution can enable power savings by limiting or reducing the amount of processing to subsets of weight and/or activation information among multiple channels (instead of processing information of all channels as performed in volume convolution (see FIG. 2A)) of a neural network implemented in an AI chip, and reducing its overall power consumption. However, in some embodiments of group convolution, convolution may learn only from some channels or adjacent channels and never learns from channels far apart from each other. Channel shuffling (see FIG. 2B) can address this drawback of group convolution by taking, mixing or introducing data from different groups to be input to a subsequent group convolution.

In an aspect, channel shuffling can be performed in element-wise manner with a few flops and a small model size. However, element-wise channel shuffling leads to extra memory accesses to implement. The present disclosure provides, in some embodiments, a solution to replace the element-wise channel shuffle with a vector-based rotation so that no extra memory passes are needed for mixing information. In some embodiments, an accelerator can move channels around every time convolution is performed, thereby learning almost every pair of groups of channels. This vector-based rotation can reduce power consumption and delay because rotation operation reduces memory movement and is computationally simple or cheap compared to channel shuffling. In some embodiments, the vector-based rotation technique can be implemented in a general matrix multiply (GEMM) accelerator.

In another aspect, element-wise channel shuffling is not hardware-friendly because it requires complex matrix operations like transposing and flattening back, and thus does not map well onto a convolutional neural network accelerator. The present disclosure provides, in some embodiments, a more hardware friendly solution to use multiplier and accumulator (MAC) circuitry or shift circuitry so as to easily implement information mixing in a convolutional neural network accelerator.

In a further aspect, the present disclosure provides a solution to reduce memory (e.g., SRAM) write cost in implementing information mixing. In some embodiments, to reduce SRAM write cost, the accelerator can be configured to write consecutive number of bytes to neighboring entries so that SRAM write can be performed in bulk. Also, in some embodiments, instead of storing convolution outputs (e.g., output activations) sequentially, the accelerator can be configured to use a channel identifier (ID) to output an address in the memory using an address mapping function (e.g., a scratchpad address mapping function).

Figure 2A:
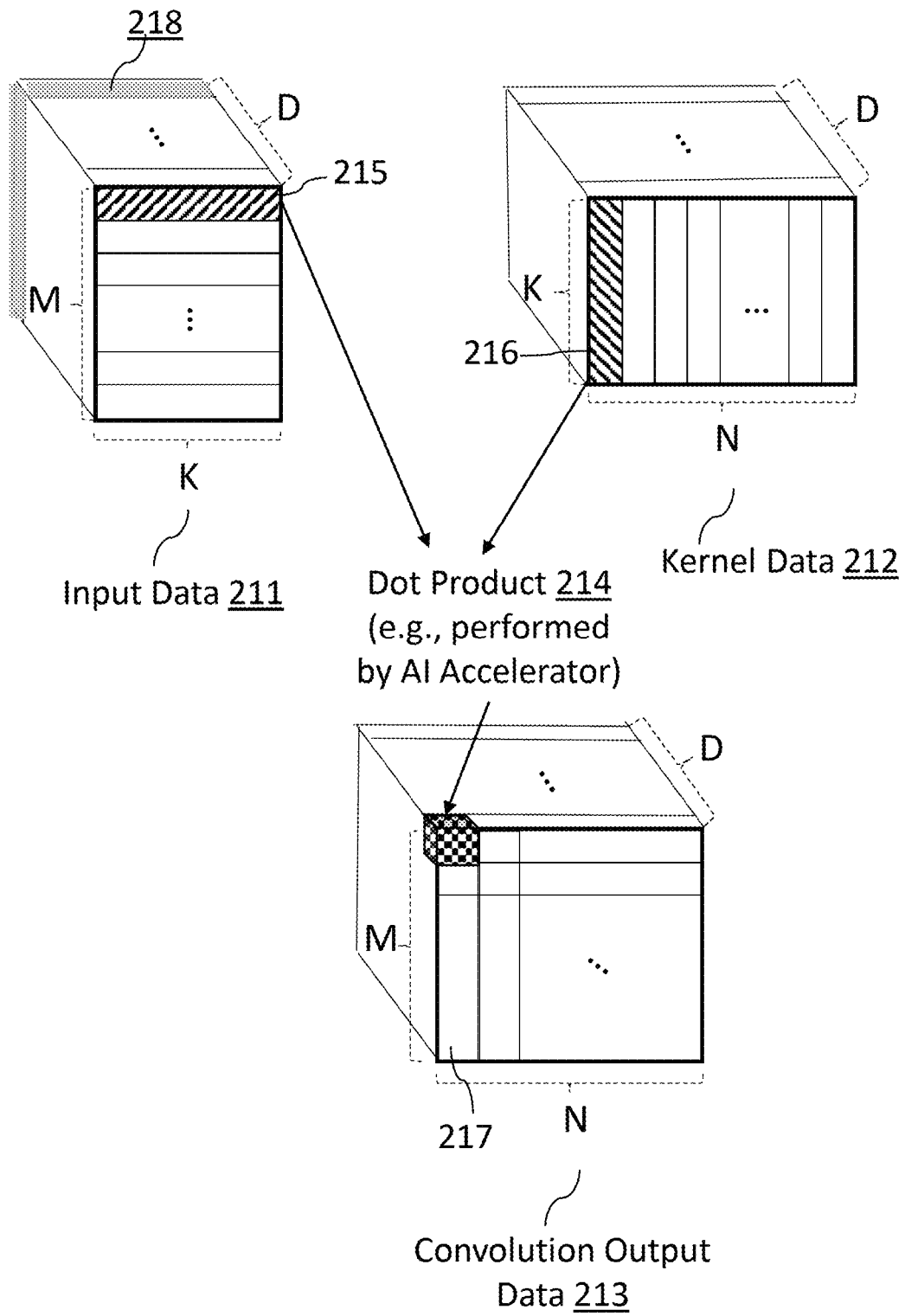
FIG. 2A includes a representation of data for performing AI related processing.

FIG. 2A includes an example representation of data for performing AI related processing. Referring to FIG. 2A, an AI accelerator (or an "accelerator") can receive an (M×K× D) input data 211 and a (K×N×D) kernel matrix 212 as kernels, where D is the number of channels. The input data 211 may include D number of channel data (e.g., single channel data 218), corresponding to the number of channels. In other words, each piece of channel data can be two-dimensional (e.g., (M×K) in FIG. 2A) or one-dimensional, depending on the dimensions of input data in a single channel. The accelerator can perform convolution to generate an (M×N×D) convolution output data 213. In some embodiments, the AI accelerator can generate the (M×N×D) convolution output data 213 by performing dot product operations 214 on one row from the input matrix 211 and a corresponding column from the kernel matrix 212 in each channel. In some embodiments, the accelerator can generate the (M×N×D) convolution output data 213 by using a General Matrix Multiplication (GEMM) algorithm. In some embodiments, the input data 211 may represent input data streams (e.g., image data) divided by M data chunks with size K in each channel for a layer of a neural network. Examples of the D number of channels can be found in red-green-blue (RGB) data, in which the number of channels is three. In some embodiments, the kernel data in each channel may represent N kernels each of which consists of K weights for a layer of a neural network.

Figure 2B:
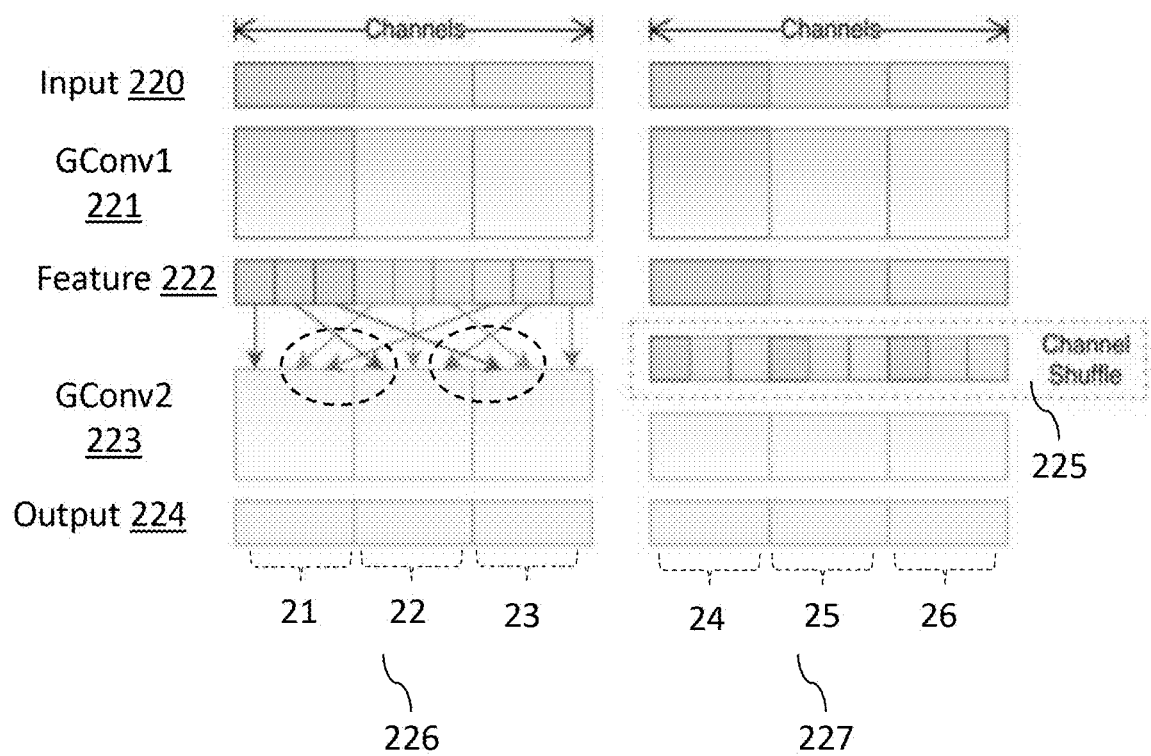
FIG. 2B is a block diagram of an embodiment of a method for performing information mixing for a layer of a neural network.

FIG. 2B is a block diagram of an embodiment of a method for performing information mixing for a layer of a neural network. FIG. 2B illustrates, among a number of aspects, a technique of information mixing, called Shufflenet, which aims to solve a problem of group convolution that has each output channel 224 only relating to input channels 220 within the group.

Referring to FIG. 2B, in a first implementation 226, for a feature map 222 generated from a previous group layer GConv1 221, the channels in each group 21, 22, 23 are first divided into three subgroups, and then each group in the next layer GConv2 223 is fed with different subgroups. GConv stands for group convolution. In a second implementation 227, for the feature map 222 generated from the previous group layer GConv1 221, the channels in each group 24, 25, 26 are first divided into three subgroups, and then channel shuffle is generated (or performed) on the three subgroups to be fed to the next layer GConv2 223.

As shown in FIG. 2B, channel shuffling can be performed in element-wise manner which requires excessive memory movement. For example, in performing a group convolution on nine channels with three groups, at least six memory movements of subgroups may occur to generate the channel shuffle 225 (see the dotted circles in FIG. 2B).

Figure 2C:
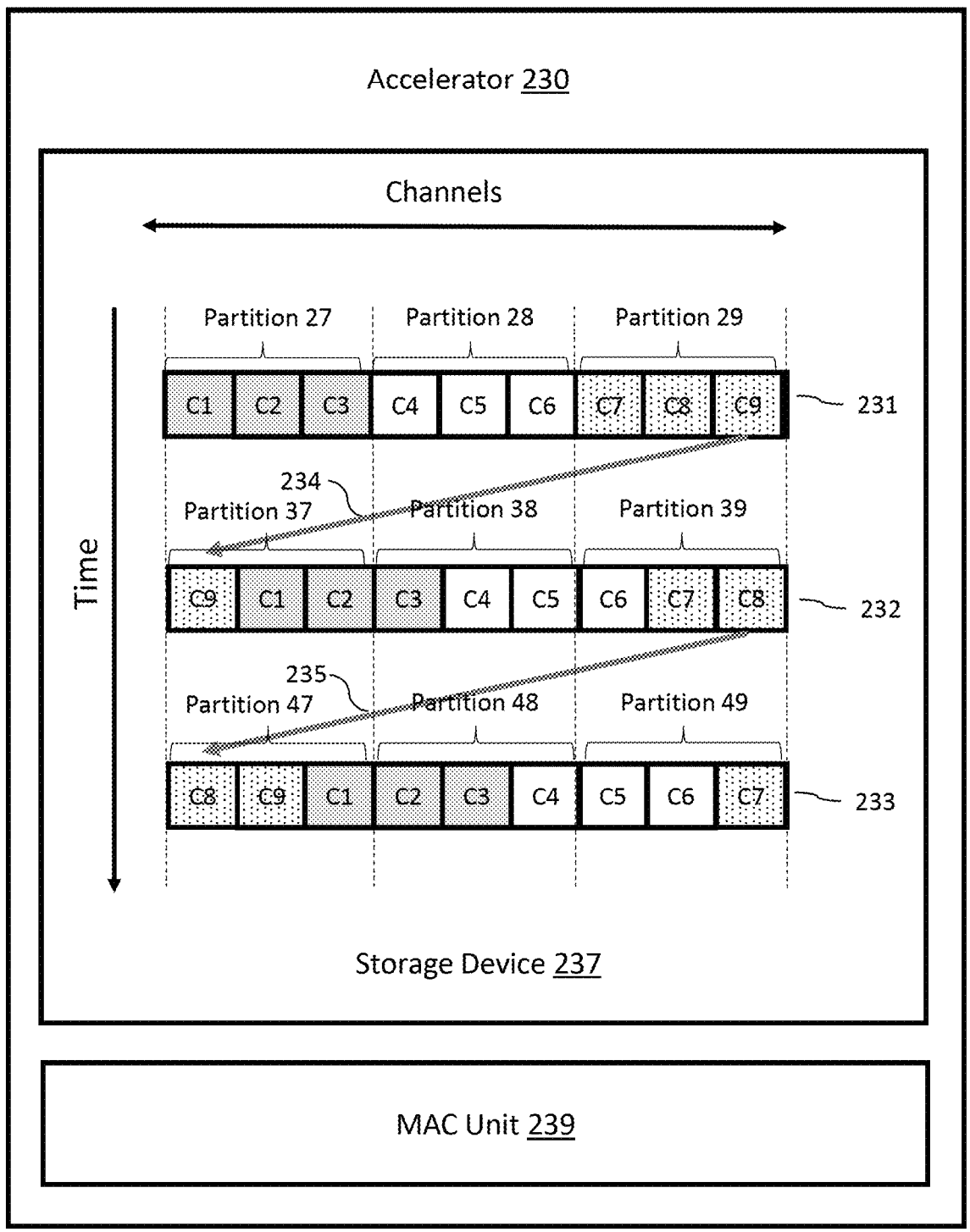
FIG. 2C is a block diagram of an embodiment of a device for performing information mixing for a layer of a neural network, according to an example implementation of the present disclosure.

FIG. 2C is a block diagram of an embodiment of a device for performing information mixing for a layer of a neural network, according to an example implementation of the present disclosure. Referring to FIG. 2C, and in some embodiments, an accelerator 230 may include a storage device 237 and a MAC unit 239. In some embodiments, the storage device 237 may have features or a configuration similar to that of the storage device 126 in FIG. 1A or the storage device 126 in FIG. 1B. In some embodiments, the MAC unit 239 may have features or a configuration similar to that of the MAC unit 140 in FIG. 1C.

In some embodiments, the storage device 237 may store a first plurality of channels 231 arranged in a first order and partitioned into a first plurality of partitions including three partitions 27, 28, 29. In some embodiments, the first plurality of channels C1, C2, C3, . . . , C9 may be stored in a continuous range of addresses in the storage device 237. Here, a single channel (e.g., channel C1) may indicate or include single channel data (e.g., single channel data 218 in FIG. 2A) which has at least one dimension.

In some embodiments, each partition 27, 28, 29 may include a corresponding partition of channels in data of a first layer of a neural network. In other embodiments, each partition 27, 28, 29 may include a result of a convolution on a corresponding partition of channels in data of a first layer of a neural network.

In some embodiments, the accelerator 230 may read the first plurality of channels 231 arranged in the first order from the storage device 237 (e.g., read from a continuous range of addresses in the storage device) and circularly shift or rotate the first plurality of channels 231 arranged in the first order (e.g., C1, C2, C3, . . . , C9) to a second plurality of channels 232 arranged in a second order (e.g., C9, C1, C2, . . . , C8), different from the first order, in a right direction (e.g., clockwise direction) as illustrated. In some embodiments, the accelerator 230 may circularly shift the first plurality of channels 231 arranged in the first order to a different order in a left direction or opposite direction (e.g., counterclockwise direction). In some embodiments, the accelerator 230 may circularly shift the first plurality of channels 231 arranged in the first order to a different order by more than one channel (e.g., channel position or channel size). For example, the first plurality of channels 231 arranged in the first order (e.g., C1, C2, C3, . . . , C9) may be circularly shifted by two channels to an order of C8, C9, C1, . . . , C7. In some embodiments, the accelerator 230 may circularly shift the first plurality of channels 231 to the second plurality of channels 232 by moving or relocating 234 a right-most channel C9 of the first plurality of channels 231 to an address location adjacent to a left-most channel C1. In some embodiments, the accelerator 230 may circularly shift the first plurality of channels 231 to a plurality of channels by moving or relocating the left-most channel C1 of the first plurality of channels 231 to an address location adjacent to the right-most channel C9. In some embodiments, the second plurality of channels C9, C1, C2, C3, . . . , C8 may be stored in a continuous range of addresses in the storage device 237.

As discussed herein, circular shifting of channels can include moving or relocating each of the channels by one channel location in memory, in a same direction, to an adjacent or next channel location (or to an adjacent or next memory address for a channel location). In some embodiments, circular shifting of channels can include updating or changing pointers to channel locations (or memory addresses) of the channels, by rotating or shifting the pointers by one channel location or one memory address, such that each of the channels can remain in its same memory location. One example implementation can include shifting the pointers, which are maintained in a chain of storage registers, in a same direction along the chain of storage registers. The amount of circular shifting for each channel can be across one or more channels positions or memory addresses.

In some embodiments, the accelerator 230 may partition the second plurality of channels 232 into a second plurality of partitions including three partitions 37, 38, 39. In some embodiments, the number of the plurality of second partitions (e.g., three partitions 37, 38, 39 in FIG. 2C) may be the same as that of the plurality of first partitions (e.g., three partitions 27, 28, 29 in FIG. 2C). Each of the plurality of second partitions may have at least one channel common with a corresponding one of the plurality of first partitions, and can have at least one channel that is different from channels in the corresponding one of the plurality of first partitions. For example, the partition 37 can have two channels (e.g., channels C1 and C2) common with the partition 27, and one channel that is different. In some embodiments, for each of the partitions 37, 38, 39, the MAC unit 239 of the accelerator 230 may perform a convolution on channels of the second plurality of channels 232 that are in a corresponding second partition, for a second layer of the neural network. For example, the MAC unit 239 may perform a convolution on the entirety of channels C9, C1, C2 in the partition 37, perform a convolution on the entirety of channels C3, C4, C5 in the partition 38, and perform a convolution on the entirety of channels C6, C7, C8 in the partition 39. In some embodiments, after performing the convolution on the second plurality of channels 232 in respective partitions of the second plurality of partitions, the MAC unit 239 may store or write a result of the convolution corresponding to respective partitions, in a location different from that of the second plurality of channels. In other words, after performing the convolution on the second plurality of channels 232 in respective partitions of the second plurality of partitions, the input channel data of the second layer of the neural network may not be overwritten and may remain in the same location. In other embodiments, after performing the convolution on the second plurality of channels 232 in respective partitions of the second plurality of partitions, the MAC unit 239 may overwrite or update the second plurality of channels with a result of the convolution corresponding to respective partitions. In other words, after performing the convolution on the second plurality of channels 232 in respective partitions of the second plurality of partitions, each partition 37, 38, 39 may include a result of the convolution on a corresponding partition of channels in data of the second layer of the neural network. In this manner, the MAC unit 239 can store the second plurality of channels C9, C1, C2, C3, . . . , C8 in a same continuous range of addresses in the storage device 237 as the data of the second layer of the neural network.

Similarly, in some embodiments, the accelerator 230 may read the second plurality of channels 232 arranged in the second order from the storage device 237 (e.g., read from a continuous range of addresses in the storage device) and circularly shift the second plurality of channels 232 arranged in the second order to a third plurality of channels 233 arranged in a third order, different from the first order and the second order, in a right direction. In some embodiments, the accelerator 230 may circularly shift the second plurality of channels 232 to the third plurality of channels 233 by moving or relocating 235 a right-most channel C8 of the second plurality of channels 232 to an address adjacent to and abutting a left-most channel C9. In some embodiments, the third plurality of channels C8, C9, C1, C2, C3, . . . , C7 may be stored in a continuous range of addresses in the storage device 237. In some embodiments, the accelerator 230 may partition the third plurality of channels 233 into a third plurality of partitions including three partitions 47, 48, 49. In some embodiments, for each of the partitions 47, 48, 49, the MAC unit 239 of the accelerator 230 may perform a convolution on channels of the third plurality of channels 233 that are in a corresponding third partition, for a third layer of the neural network. For example, the MAC unit 239 may perform a convolution on the entirety of channels C8, C9, C1 in the partition 47, perform a convolution on the entirety of channels C2, C3, C4 in the partition 48, and perform a convolution on the entirety of channels C5, C6, C7 in the partition 49. In some embodiments, after performing the convolution on the third plurality of channels 233 in respective partitions of the third plurality of partitions, the MAC unit 239 may store or write a result of the convolution corresponding to respective partitions in a location different from that of the third plurality of channels. In other words, after performing the convolution on the third plurality of channels 233 in respective partitions of the third plurality of partitions, the input data of the third layer of the neural network may not be overwritten and may remain in the same location. In other embodiments, after performing the convolution on the third plurality of channels 233 in respective partitions of the third plurality of partitions, the MAC unit 239 may overwrite or update the third plurality of channels with a result of the convolution corresponding to respective partitions. In other words, after performing the convolution on the third plurality of channels 233 in respective partitions of the third plurality of partitions, each partition 47, 48, 49 may include a result of the convolution on a corresponding partition of channels in data of the third layer of the neural network. In this manner, the MAC unit 239 can store the third plurality of channels C8, C9, C1, C2, C3, . . . , C7 in a same continuous range of addresses in the storage device 237 as the data of the third layer of the neural network.

The embodiment illustrated in FIG. 2C can provide a solution to replace the element-wise channel shuffle (see FIG. 2B) with a vector-based rotation so that no extra memory passes are needed for mixing information. The accelerator 230 can move channels around (via circular rotation or shifting) every time a group convolution is performed, thereby learning across almost every pair of partitions of channels. This vector-based rotation (or circular shift) can reduce power consumption and delay because rotation operation can reduce memory passes, operations and/or movement, and is computationally cheap or efficient compared to channel shuffling. For example, in performing a group convolution on nine channels with three partitions (or groups), only one memory movement (e.g., the movement 234) may be performed, while the alternative method of channel shuffling requires at least six memory movements of subgroups to generate channel shuffle (see the dotted circles in FIG. 2B). Moreover, the embodiment illustrated in FIG. 2C can provide a solution to reduce memory (e.g., SRAM) write cost in implementing information mixing or sharing. To reduce SRAM write cost, the accelerator 230 can write consecutive number of bytes to neighboring entries (e.g., writing the channel C9 to a neighboring entry of the channel C1 in the movement 234). In this manner, all of the channels can be stored in a continuous range of addresses in the storage device 237 (e.g., SRAM) so that SRAM write and/or SRAM read can be performed in bulk. For example, after completion of a group convolution on the second plurality of partitions 37, 38, 39, the entirety of the second plurality of channels 232 (C9, C1, C2, C3, . . . , C8) can be updated or overwritten with convolution results in bulk (e.g., by performing a bulk-write on an SRAM), thereby saving SRAM write cost compared to element-wise channel shuffling and fragmented writes to memory.

Figure 2D:
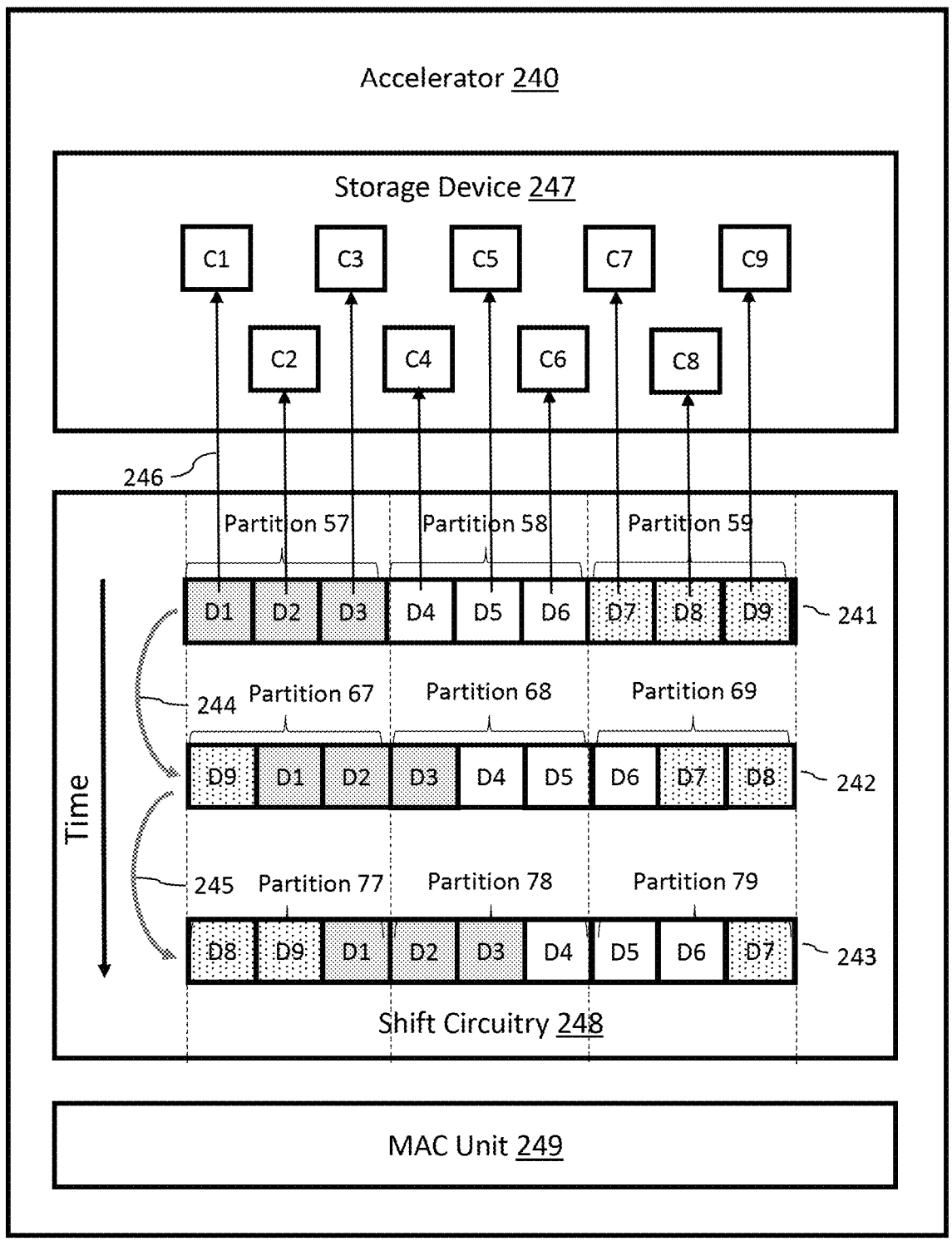
FIG. 2D is a block diagram of an embodiment of a device for performing information mixing for a layer of a neural network, according to an example implementation of the present disclosure.

FIG. 2D is a block diagram of an embodiment of a device for performing information mixing for a layer of a neural network, according to an example implementation of the present disclosure. Referring to FIG. 2D, in some embodiments, an accelerator 240 may include a storage device 247 and a MAC unit 249. In some embodiments, the storage device 247 may have features or a configuration similar to that of the storage device 126 in FIG. 1A or the storage device 124 in FIG. 1B. In some embodiments, the MAC unit 249 may have features or a configuration similar to that of the MAC unit 140 in FIG. 1C. The accelerator 240 may include shift circuitry 248. In some embodiments, the shift circuitry 248 may include one or more shift registers that can circularly shift data to the right or left (e.g., forward or reverse, or first or second) direction. In some embodiments, the shift circuitry 248 may be a barrel shifter that can circularly shift data by a specified number of bits. In some embodiments, the shift circuitry 248 may include a processor similar to the processor 124 in FIG. 1A, which can implement circular shifting using built-in bitwise operation.

In some embodiments, the shift circuitry 248 may store a first plurality of channel identifiers (or channel indexes) D1, D2, . . . , D9 which can identify corresponding channels C1, C2, . . . , C9 that are stored in the storage device 247. The first plurality of channel identifiers D1, D2, . . . , D9 arranged in this order (first order) can represent the corresponding first plurality of channels C1, C2, . . . , C9 arranged in the first order in data of a first layer of a neural network. In some embodiments, each channel identifier may be translated to an address of the corresponding channel in the storage device 247 using a memory mapping function (e.g., with pointers or mappings to memory addresses). In some embodiments, the memory mapping function may include a hash function (e.g., XOR based hash functions) or an address mapping (or pointers) table or a scratchpad address mapping function. For example, referring to FIG. 2D, the accelerator 240 may perform address mapping 246 to translate the identifier (or pointer) D1 to an address of the corresponding channel C1 using a memory mapping function.

In some embodiments, the first plurality of channels arranged in the first order (C1, C2, . . . , C9) by the plurality of channel identifier 241 may be partitioned into a first plurality of partitions including three partitions 57, 58, 59. In some embodiments, each partition 57, 58, 59 may include a corresponding partition of channels in data of a first layer of a neural network. In other embodiments, each partition 57, 58, 59 may include a result of a convolution on a corresponding partition of channels in the data of the first layer of the neural network. Here, a single channel (e.g., channel C1) may indicate single channel data (e.g., single channel data 218 in FIG. 2A) which has at least one dimension.

In some embodiments, the shift circuitry 248 may circularly shift the first plurality of channel identifiers 241 arranged in the first order (e.g., D1, D2, . . . , D9) to a second plurality of channel identifiers 242 arranged in a second order (e.g., D9, D1, D2, . . . , D8), different from the first order, in a right direction. In some embodiments, the shift circuitry 248 may circularly shift the first plurality of channel identifiers 241 arranged in the first order to a different order in a left direction. In some embodiments, the shift circuitry 248 may circularly shift the first plurality of channels identifiers 241 arranged in the first order to a different order by more than one channel identifier. For example, the first plurality of channel identifiers 241 arranged in the first order (e.g., D1, D2, D3, . . . , D9) may be circularly shifted by two channel identifiers to an order of D8, D9, D1, . . . , D7. Referring to FIG. 2D, the second plurality of channel identifiers D9, D1, D2, . . . , D8 arranged in the second order can represent the corresponding second plurality of channels C9, C1, C2, . . . , C8 arranged in the second order in data of a second layer of the neural network. Here, the second plurality of channels C9, C1, C2, C3, . . . , C8 are not necessarily stored in a continuous range of addresses in the storage device 247. In some embodiments, the accelerator 240 may partition the second plurality of channel identifiers 242 into a second plurality of partitions including three partitions 67, 68, 69. In some embodiments, for each of the partitions 67, 68, 69, the MAC unit 249 of the accelerator 240 may perform a convolution on channels of the second plurality of channels that are in a corresponding second partition, for the second layer of the neural network. For example, the MAC unit 249 may read channels of the second plurality of channels in respective partitions using the corresponding channel identifiers, and perform a convolution on the entirety of channels C9, C1, C2 in the partition 67, perform a convolution on the entirety of channels C3, C4, C5 in the partition 68, and perform a convolution on the entirety of channels C6, C7, C8 in the partition 69. In some embodiments, after performing the convolution on the second plurality of channels in respective partitions of the second plurality of partitions, the MAC unit 249 may store or write a result of the convolution corresponding to respective partitions in a location different from that of the second plurality of channels. In other words, after performing the convolution on the second plurality of channels in respective partitions of the second plurality of partitions, the input data of the second layer of the neural network may not be overwritten and may remain in the same location. In other embodiments, after performing the convolution on the second plurality of channels in respective partitions of the second plurality of partitions, the MAC unit 249 may overwrite or update the second plurality of channels with a result of the convolution corresponding to respective partitions of the second plurality of partitions using the corresponding the second plurality of channel identifiers. In other words, after performing the convolution on the second plurality of channels in respective partitions of the second plurality of partitions, channels corresponding to each partition 67, 68, 69 may include a result of the convolution on a corresponding partition of channels in the data of the second layer of the neural network.

Similarly, the shift circuitry 248 may circularly shift the second plurality of channel identifiers 242 arranged in the second order to a third plurality of channel identifiers 243 arranged in a third order (e.g., D8, D9, D1, D2, . . . , D7), different from the first order and the second order, in a right direction. Referring to FIG. 2D, the third plurality of channel identifiers D8, D9, D1, D2, . . . , D7 arranged in the third order can represent the corresponding third plurality of channels C8, C9, C1, C2, . . . , C7 arranged in the second order in data of a third layer of the neural network. Here, the third plurality of channels C8, C9, C1, C2, . . . , C7 are not necessarily stored in a continuous range of addresses in the storage device 247. In some embodiments, the accelerator 240 may partition the third plurality of channel identifiers 243 into a third plurality of partitions including three partitions 77, 78, 79. In some embodiments, for each of the partitions 77, 78, 79, the MAC unit 249 of the accelerator 240 may perform a convolution on channels of the third plurality of channels that are in a corresponding third partition, for the third layer of the neural network. For example, the MAC unit 249 may read channels of the third plurality of channels in respective partitions using the corresponding channel identifiers, and perform a convolution on the entirety of channels C8, C9, C1 in the partition 77, perform a convolution on the entirety of channels C2, C3, C4 in the partition 78, and perform a convolution on the entirety of channels C5, C6, C7 in the partition 79. In some embodiments, after performing the convolution on the third plurality of channels in respective partitions of the third plurality of partitions, the MAC unit 249 may store or write a result of the convolution corresponding to respective partitions in a location different from that of the third plurality of channels. In other words, after performing the convolution on the third plurality of channels in respective partitions of the third plurality of partitions, the input data of the third layer of the neural network may not be overwritten and may remain in the same location. In other embodiments, after performing the convolution on the third plurality of channels in respective partitions of the third plurality of partitions, the MAC unit 249 may overwrite or update the third plurality of channels with a result of the convolution corresponding to respective partitions of the third plurality of partitions using the corresponding third plurality of channel identifiers. In other words, after performing the convolution on the third plurality of channels in respective partitions of the third plurality of partitions, channels corresponding to each partition 77, 78, 79 may include a result of the convolution on a corresponding partition of channels in data of the third layer of the neural network.

The embodiment illustrated in FIG. 2D can provide a solution to replace the element-wise channel shuffle (see FIG. 2B) with a vector-based rotation by circularly shifting channel identifiers (or pointers) instead of rotating channel data. In this manner, the vector-based rotation can be performed without any memory movement that would be needed for the conventional shuffle operation. This vector-based rotation (or circular shift) can reduce power consumption and delay because rotation operation in the shift circuitry eliminates memory movement and is computationally cheap or efficient compared to channel shuffling. Moreover, the embodiment illustrated in FIG. 2D can provide a more hardware friendly solution to use the MAC circuitry or the shift circuitry so as to easily implement information mixing in a convolutional accelerator. Furthermore, the embodiment illustrated in FIG. 2D can provide a solution to reduce memory (e.g., SRAM) write cost in implementing information mixing by mapping channel identifiers to an address in the memory using an address mapping function.

In some embodiments of the present disclosure, a device (e.g., the accelerator 230 in FIG. 2C) may include a memory (e.g., the storage device 237) and circuitry (e.g., the MAC unit 239 in FIG. 2C, the shift circuitry 248). The memory may be configured to store data of a current layer of a neural network (e.g., the first plurality of channels 231 in FIG. 2C). The data may include a plurality of channels arranged in a first order (e.g., C1, C2, C3, . . . , C9 in FIG. 2C) and partitioned into a plurality of first partitions (e.g., partitions 27, 28, 29 in FIG. 2C) according to the first order. A channel of the plurality of channels (e.g., channel C1 in FIG. 2C) may be an array of data having at least one dimension (e.g., channel data 218 in FIG. 2A). In some embodiments, each first partition (e.g., partition 27, 28, 29) may include a corresponding partition of channels in data of a previous layer of the neural network. In other embodiments, each first partition (e.g., partitions 27, 28, 29 in FIG. 2C) may include a result of a convolution on a corresponding partition of channels in data of a previous layer of the neural network. The circuitry (e.g., the MAC unit 239 in FIG. 2C) may be configured to shift the plurality of channels arranged in the first order (e.g., C1, C2, C3, . . . , C9 in FIG. 2C) to a second order (e.g., C9, C1, C2, C3, . . . , C8 in FIG. 2C). The circuitry may be configured to partition the shifted plurality of channels (e.g., the second plurality of channels 232 in FIG. 2C) into a plurality of second partitions (e.g., the partitions 37, 38, 39 in FIG. 2C), according to the second order. For each of the plurality of second partitions (e.g., the partition 37 in FIG. 2C), the circuitry may be configured to perform a convolution on channels of the shifted plurality of channels that are in the corresponding second partition (e.g., channels C9, C1, C2 in the partition 37 in FIG. 2C).

In some embodiments, the circuitry may be configured to circularly shift the plurality of channels arranged in the first order (e.g., C1, C2, . . . , C9 in FIG. 2C) to the second order (e.g., C8, C9, C1, . . . , C7) by a determined number of channels. In some embodiments, the circuitry may be further configured to write the plurality of channels arranged in the second order (e.g., the second plurality of channels 232 in FIG. 2C), to a continuous range of addresses of the memory. The circuitry may be further configured to read the plurality of channels arranged in the second order, from the continuous range of addresses of the memory.

In some embodiments, each of the plurality of channels (e.g., C1, C2, C3, . . . , C9 in FIG. 2D) may have a corresponding identifier (e.g., D1, D2, D3, . . . , D9 in FIG. 2D). In some embodiments, the circuitry may include shift circuitry (e.g., the shift circuitry 248 in FIG. 2D) configured to circularly shift the plurality of channels arranged in the first order. The shift circuitry may be configured to circularly shift the plurality of channels arranged in the first order in one of a right direction or a left direction (e.g., forward or reverse direction, first or second direction). The circuitry may be configured to identify a memory address of a particular channel of the plurality of channels (e.g., a memory address of the channel C1 in FIG. 2D) by applying an address mapping function (e.g., address mapping 246 in FIG. 2D) to an identifier corresponding to the particular channel (e.g., the channel identifier D1 in FIG. 2D). The circuitry may be configured to read the particular channel from the identified address of the particular channel in the memory.

In some embodiments, the number of the plurality of second partitions (e.g., three partitions 37, 38, 39 in FIG. 2C) may be the same as that of the plurality of first partitions (e.g., three partitions 27, 28, 29 in FIG. 2C). Each of the plurality of second partitions may have at least one channel common with a corresponding one of the plurality of first partitions (for example, the partition 37 has two channels C1 and C2 common with the partition 27; see FIG. 2C).

In some embodiments, the circuitry may include multiplier and accumulator (MAC) circuitry (e.g., the MAC unit 239 in FIG. 2C) configured to perform, for each of the plurality of second partitions (e.g., partitions 37, 38, 39 in FIG. 2C), the convolution on channels of the circularly shifted plurality of channels that are in the corresponding second partition.

Figure 2E:
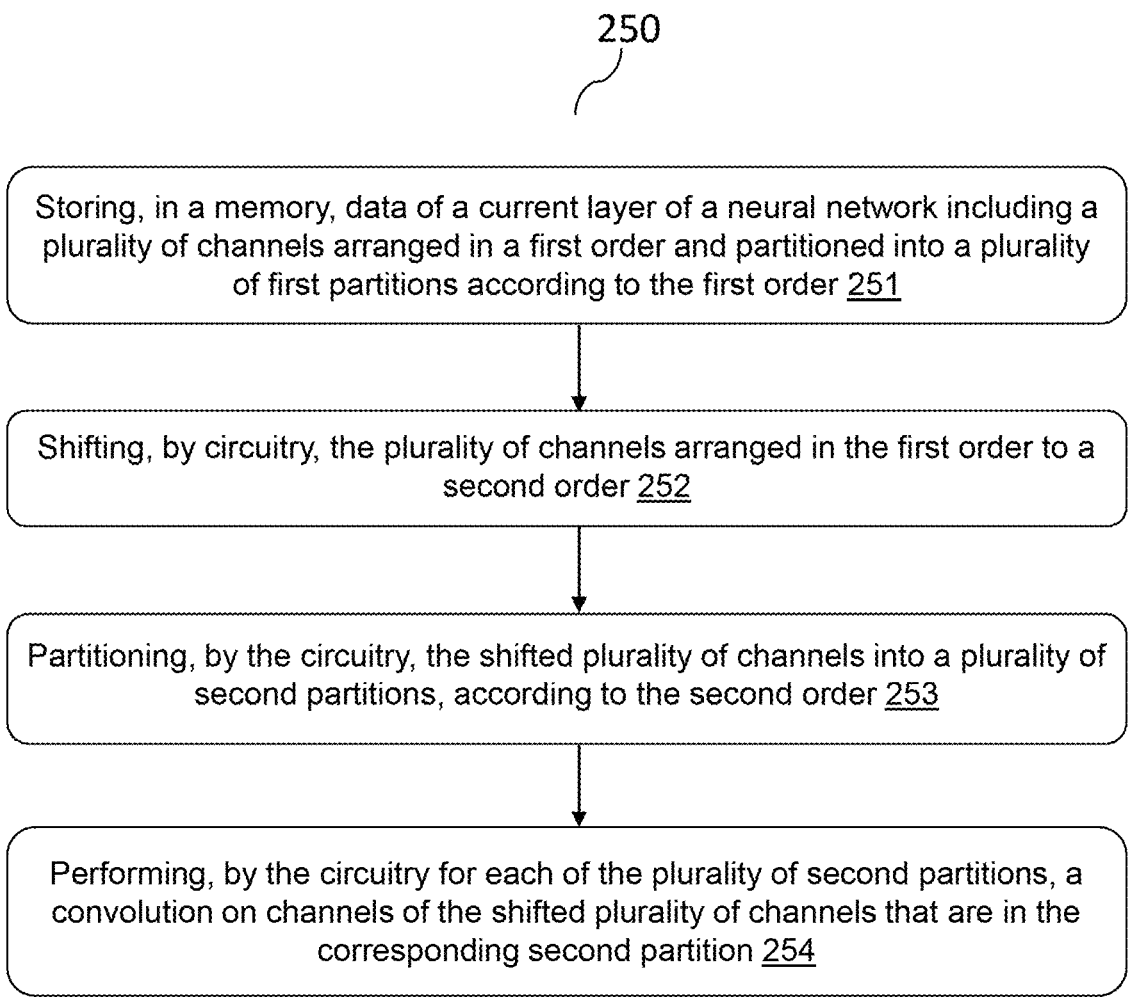
FIG. 2E is a flow chart illustrating a method for performing information mixing for a layer of a neural network, according to an example implementation of the present disclosure.

FIG. 2E is a flow chart illustrating a method for performing information mixing for a layer of a neural network, according to an example implementation of the present disclosure. In brief overview, the method includes storing, in a memory, data of a current layer of a neural network, the data comprising a plurality of channels arranged in a first order and partitioned into a plurality of first partitions according to the first order (251). The method can include shifting, by circuitry, the plurality of channels arranged in the first order to a second order (252). The method can include partitioning, by the circuitry, the shifted plurality of channels into a plurality of second partitions, according to the second order (253). The method can include performing, by the circuitry for each of the plurality of second partitions, a convolution on channels of the shifted plurality of channels that are in the corresponding second partition (254).

In further details of 251, and in some embodiments, circuitry (e.g., the MAC unit 239 in FIG. 2C, the shift circuitry 248) of a device (e.g., the accelerator 230 in FIG. 2C) stores, in a memory (e.g., the storage device 237), data of a current layer of a neural network (e.g., the first plurality of channels 231 in FIG. 2C). The data can include a plurality of channels arranged in a first order (e.g., C1, C2, C3, ..., C9 in FIG. 2C) and partitioned into a plurality of first partitions (e.g., partitions 27, 28, 29 in FIG. 2C) according to the first order. A channel of the plurality of channels (e.g., channel C1 in FIG. 2C) is an array of data having at least one dimension (e.g., channel data 218 in FIG. 2A). In some embodiments, each first partition (e.g., partition 27, 28, 29 in FIG. 2C) includes a corresponding partition of channels in data of a previous layer of the neural network. In other embodiments, each first partition (e.g., partitions 27, 28, 29 in FIG. 2C) includes a result of a convolution on a corresponding partition of channels in data of a previous layer of the neural network. For example, in FIG. 2C, channels C1-C3 of the first plurality of channels 231 may be a result of a convolution on the partition 27 in data of a previous layer of the neural network In further details of 252, and in some embodiments, the circuitry (e.g., the MAC unit 239 in FIG. 2C) shifts the plurality of channels arranged in the first order (e.g., C1, C2, C3, ..., C9 in FIG. 2C) to a second order (e.g., C9, C1, C2, C3, ..., C8 in FIG. 2C). In some embodiments, the circuitry circularly shifts the plurality of channels arranged in the first order (e.g., C1, C2, ..., C9 in FIG. 2C) to the second order (e.g., C8, C9, C1, ..., C7) by a determined number of channels. For example, in FIG. 2C, the MAC unit 239 circularly shifts the plurality of channels arranged in the first order (e.g., C1, C2, ..., C9 in FIG. 2C) to the second order (e.g., C9, C1, C2, C3, ..., C8 in FIG. 2C) by one channel, but in some embodiments, the plurality of channels arranged in the first order (e.g., C1, C2, ..., C9 in FIG. 2C) can be circularly shifted by two channels to a different order (e.g., C8, C9, C1, ..., C7).

In some embodiments, the circuitry writes the plurality of channels arranged in the second order (e.g., the second plurality of channels 232 in FIG. 2C), to a continuous range of addresses of the memory. For example, in FIG. 2C, the accelerator 230 can circularly shift the first plurality of channels 231 to the second plurality of channels 232 by moving or relocating 234 a right-most channel C9 of the first plurality of channels 231 to an address adjacent to a left-most channel C1. In this manner, the accelerator 230 can store the second plurality of channels C9, C1, C2, C3, ..., C8 in a continuous range of addresses in the storage device 237. In some embodiments, the circuitry reads the plurality of channels arranged in the second order, from the continuous range of addresses of the memory. For example, in FIG. 2C, the accelerator 230 can read the second plurality of channels 232 from a continuous range of addresses in the storage device 237.

In some embodiments, shift circuitry (e.g., the shift circuitry 248 in FIG. 2D) circularly shifts the plurality of channels arranged in the first order by shifting a plurality of channel identifiers arranged in the first order (e.g., the first plurality of channel identifiers 241). The shift circuitry can circularly shift or rotate the plurality of channels arranged in the first order by shifting the corresponding plurality of channel identifiers in one of a right direction or a left direction. For example, in FIG. 2D, the shift circuitry 248 circularly shifts the first plurality of channel identifiers 241 arranged in the first order (e.g., D1, D2, ..., D9) to a second plurality of channel identifiers 242 arranged in a second order (e.g., D9, D1, D2, ..., D8), different from the first order, in a right direction. In this manner, the second plurality of channel identifiers D9, D1, D2, ..., D8 arranged in the second order can represent the corresponding second plurality of channels C9, C1, C2, ..., C8 arranged in the second order in data of a second layer of the neural network.

In some embodiments, in FIG. 2D, each of the plurality of channels (e.g., C1, C2, C3, ..., C9 in FIG. 2D) has a corresponding identifier (e.g., D1, D2, D3, ..., D9 in FIG. 2D). The circuitry can identify a memory address of a particular channel of the plurality of channels (e.g., a memory address of the channel C1 in FIG. 2D) by applying an address mapping function (e.g., address mapping 246 in FIG. 2D) to an identifier corresponding to the particular channel (e.g., the channel identifier D1 in FIG. 2D). The circuitry can read the particular channel (e.g., channel C1) from the identified address of the particular channel in the memory (e.g., an address of channel C1 identified by applying an address mapping function to the channel identifier D1 of the channel C1).

In further details of 253, and in some embodiments, the circuitry partitions the shifted plurality of channels (e.g., the second plurality of channels 232 in FIG. 2C) into a plurality of second partitions (e.g., the partitions 37, 38, 39 in FIG. 2C), according to the second order. In some embodiments, the number of the plurality of second partitions (e.g., three partitions 37, 38, 39 in FIG. 2C) may be the same as that of the plurality of first partitions (e.g., three partitions 27, 28, 29 in FIG. 2C). Each of the plurality of second partitions may have at least one channel common with a corresponding one of the plurality of first partitions (for example, the partition 37 has two channels C1 and C2 common with the partition 27; see FIG. 2C).

In further details of 254, and in some embodiments, the circuitry performs, for each of the plurality of second partitions (e.g., the partition 37 in FIG. 2C), a convolution on channels of the shifted plurality of channels that are in the corresponding second partition (e.g., channels C9, C1, C2 in the partition 37 in FIG. 2C). In some embodiments, MAC circuitry of the circuitry (e.g., the MAC unit 239 in FIG. 2C) performs, for each of the plurality of second partitions (e.g., partitions 37, 38, 39 in FIG. 2C), the convolution on channels of the circularly shifted plurality of channels that are in the corresponding second partition. For example, the MAC unit 239 can perform a convolution on the entirety of channels C9, C1, C2 in the partition 37, perform a convolution on the entirety of channels C3, C4, C5 in the partition 38, and perform a convolution on the entirety of channels C6, C7, C8 in the partition 39. In some embodiments, after performing the convolution on the second plurality of channels 232 in respective partitions of the second plurality of partitions, the MAC unit 239 may store or write a result of the convolution corresponding to respective partitions in a location different from that of the second plurality of channels. In other words, after performing the convolution on the second plurality of channels 232 in respective partitions of the second plurality of partitions, the input data of the second layer of the neural network may not be overwritten and may remain in the same location. In other embodiments, in FIG. 2C, after performing the convolution on the second plurality of channels 232 in respective partitions of the second plurality of partitions, the MAC unit 239 may overwrite or update the second plurality of channels with a result of the convolution corresponding to respective partitions. In other words, after performing the convolution on the second plurality of channels 232 in respective partitions of the second plurality of partitions, each partition 37, 38, 39 includes a result of the convolution on a corresponding partition of channels in data of the second layer of the neural network.

Having now described some illustrative implementations, it is apparent that the foregoing is illustrative and not limiting, having been presented by way of example. In particular, although many of the examples presented herein involve specific combinations of method acts or system elements, those acts and those elements can be combined in other ways to accomplish the same objectives. Acts, elements and features discussed in connection with one implementation are not intended to be excluded from a similar role in other implementations or implementations.

The hardware and data processing components used to implement the various processes, operations, illustrative logics, logical blocks, modules and circuits described in connection with the embodiments disclosed herein may be implemented or performed with a general purpose single- or multi-chip processor, a digital signal processor (DSP), an application specific integrated circuit (ASIC), a field programmable gate array (FPGA), or other programmable logic device, discrete gate or transistor logic, discrete hardware components, or any combination thereof designed to perform the functions described herein. A general purpose processor may be a microprocessor, or, any conventional processor, controller, microcontroller, or state machine. A processor also may be implemented as a combination of computing devices, such as a combination of a DSP and a microprocessor, a plurality of microprocessors, one or more microprocessors in conjunction with a DSP core, or any other such configuration. In some embodiments, particular processes and methods may be performed by circuitry that is specific to a given function. The memory (e.g., memory, memory unit, storage device, etc.) may include one or more devices (e.g., RAM, ROM, Flash memory, hard disk storage, etc.) for storing data and/or computer code for completing or facilitating the various processes, layers and modules described in the present disclosure. The memory may be or include volatile memory or non-volatile memory, and may include database components, object code components, script components, or any other type of information structure for supporting the various activities and information structures described in the present disclosure. According to an exemplary embodiment, the memory is communicably connected to the processor via a processing circuit and includes computer code for executing (e.g., by the processing circuit and/or the processor) the one or more processes described herein.

The present disclosure contemplates methods, systems and program products on any machine-readable media for accomplishing various operations. The embodiments of the present disclosure may be implemented using existing computer processors, or by a special purpose computer processor for an appropriate system, incorporated for this or another purpose, or by a hardwired system. Embodiments within the scope of the present disclosure include program products comprising machine-readable media for carrying or having machine-executable instructions or data structures stored thereon. Such machine-readable media can be any available media that can be accessed by a general purpose or special purpose computer or other machine with a processor. By way of example, such machine-readable media can comprise RAM, ROM, EPROM, EEPROM, or other optical disk storage, magnetic disk storage or other magnetic storage devices, or any other medium which can be used to carry or store desired program code in the form of machine-executable instructions or data structures and which can be accessed by a general purpose or special purpose computer or other machine with a processor. Combinations of the above are also included within the scope of machine-readable media. Machine-executable instructions include, for example, instructions and data which cause a general purpose computer, special purpose computer, or special purpose processing machines to perform a certain function or group of functions.

The phraseology and terminology used herein is for the purpose of description and should not be regarded as limiting. The use of "including" "comprising" "having" "containing" "involving" "characterized by" "characterized in that" and variations thereof herein, is meant to encompass the items listed thereafter, equivalents thereof, and additional items, as well as alternate implementations consisting of the items listed thereafter exclusively. In one implementation, the systems and methods described herein consist of one, each combination of more than one, or all of the described elements, acts, or components.

Any references to implementations or elements or acts of the systems and methods herein referred to in the singular can also embrace implementations including a plurality of these elements, and any references in plural to any implementation or element or act herein can also embrace implementations including only a single element. References in the singular or plural form are not intended to limit the presently disclosed systems or methods, their components, acts, or elements to single or plural configurations. References to any act or element being based on any information, act or element can include implementations where the act or element is based at least in part on any information, act, or element.

Any implementation disclosed herein can be combined with any other implementation or embodiment, and references to "an implementation," "some implementations," "one implementation" or the like are not necessarily mutually exclusive and are intended to indicate that a particular feature, structure, or characteristic described in connection with the implementation can be included in at least one implementation or embodiment. Such terms as used herein are not necessarily all referring to the same implementation. Any implementation can be combined with any other implementation, inclusively or exclusively, in any manner consistent with the aspects and implementations disclosed herein.

Where technical features in the drawings, detailed description or any claim are followed by reference signs, the reference signs have been included to increase the intelligibility of the drawings, detailed description, and claims. Accordingly, neither the reference signs nor their absence have any limiting effect on the scope of any claim elements.

Systems and methods described herein may be embodied in other specific forms without departing from the characteristics thereof. References to "approximately," "about" "substantially" or other terms of degree include variations of +/−10% from the given measurement, unit, or range unless explicitly indicated otherwise. Coupled elements can be electrically, mechanically, or physically coupled with one another directly or with intervening elements. Scope of the systems and methods described herein is thus indicated by the appended claims, rather than the foregoing description, and changes that come within the meaning and range of equivalency of the claims are embraced therein.

The term "coupled" and variations thereof includes the joining of two members directly or indirectly to one another. Such joining may be stationary (e.g., permanent or fixed) or moveable (e.g., removable or releasable). Such joining may be achieved with the two members coupled directly with or to each other, with the two members coupled with each other using a separate intervening member and any additional intermediate members coupled with one another, or with the two members coupled with each other using an intervening member that is integrally formed as a single unitary body with one of the two members. If "coupled" or variations thereof are modified by an additional term (e.g., directly coupled), the generic definition of "coupled" provided above is modified by the plain language meaning of the additional term (e.g., "directly coupled" means the joining of two members without any separate intervening member), resulting in a narrower definition than the generic definition of "coupled" provided above. Such coupling may be mechanical, electrical, or fluidic.

References to "or" can be construed as inclusive so that any terms described using "or" can indicate any of a single, more than one, and all of the described terms. A reference to "at least one of 'A' and 'B'" can include only 'A', only 'B', as well as both 'A' and 'B'. Such references used in conjunction with "comprising" or other open terminology can include additional items.

Modifications of described elements and acts such as variations in sizes, dimensions, structures, shapes and proportions of the various elements, values of parameters, mounting arrangements, use of materials, colors, orientations can occur without materially departing from the teachings and advantages of the subject matter disclosed herein. For example, elements shown as integrally formed can be constructed of multiple parts or elements, the position of elements can be reversed or otherwise varied, and the nature or number of discrete elements or positions can be altered or varied. Other substitutions, modifications, changes and omissions can also be made in the design, operating conditions and arrangement of the disclosed elements and operations without departing from the scope of the present disclosure.

References herein to the positions of elements (e.g., "top," "bottom," "above," "below") are merely used to describe the orientation of various elements in the FIGURES. The orientation of various elements may differ according to other exemplary embodiments, and that such variations are intended to be encompassed by the present disclosure.

What is claimed is:

1. A device comprising:
    a memory configured to store data of a current layer of a neural network, the data comprising a plurality of channels arranged in a first order and partitioned into a plurality of first partitions according to the first order, each first partition comprising a result of a convolution on a corresponding partition of channels in data of a previous layer of the neural network; and
    circuitry configured to:
        shift the plurality of channels arranged in the first order to a second order;
        partition the shifted plurality of channels into a plurality of second partitions, according to the second order; and
        for each of the plurality of second partitions, perform a convolution on channels of the shifted plurality of channels that are in the corresponding second partition,
    wherein the circuitry is further configured to write the plurality of channels arranged in the second order, to a continuous range of addresses of the memory,
    wherein the circuitry is further configured to read the plurality of channels arranged in the second order, from the continuous range of addresses of the memory.

2. The device according to claim 1, wherein a channel of the plurality of channels comprises an array of data having at least one dimension.

3. The device according to claim 1, wherein the circuitry is configured to circularly shift the plurality of channels arranged in the first order to the second order by a determined number of channels.

4. The device according to claim 1, wherein:
    a number of the plurality of second partitions is the same as that of the plurality of first partitions, and
    each of the plurality of second partitions has at least one channel common with a corresponding one of the plurality of first partitions.

5. The device according to claim 1, wherein the circuitry comprises:
    shift circuitry configured to circularly shift the plurality of channels arranged in the first order; and
    multiplier and accumulator (MAC) circuitry configured to perform, for each of the plurality of second partitions, the convolution on channels of the circularly shifted plurality of channels that are in the corresponding second partition.

6. The device according to claim 5, wherein the shift circuitry is configured to circularly shift the plurality of channels arranged in the first order in one of a right direction or a left direction.

7. A method comprising:
    storing, in a memory, data of a current layer of a neural network, the data comprising a plurality of channels arranged in a first order and partitioned into a plurality of first partitions according to the first order, each first partition comprising a result of a convolution on a corresponding partition of channels in data of a previous layer of the neural network;
    shifting, by circuitry, the plurality of channels arranged in the first order to a second order;

partitioning, by the circuitry, the shifted plurality of channels into a plurality of second partitions, according to the second order;

performing, by the circuitry for each of the plurality of second partitions, a convolution on channels of the shifted plurality of channels that are in the corresponding second partition; and writing the plurality of channels arranged in the second order, to a continuous range of addresses of the memory.

8. The method according to claim 7, wherein a channel of the plurality of channels comprises an array of data having at least one dimension.

9. The method according to claim 7, wherein the plurality of channels arranged in the first order is circularly shifted to the second order by a determined number of channels.

10. The method according to claim 7, further comprising reading the plurality of channels arranged in the second order, from the continuous range of addresses of the memory.

11. The method according to claim 7, wherein:
a number of the plurality of second partitions is the same as that of the plurality of first partitions, and
each of the plurality of second partitions has at least one channel common with a corresponding one of the plurality of first partitions.

12. The method according to claim 7, comprising:
circularly shifting, by shift circuitry, the plurality of channels arranged in the first order; and
performing, by multiplier and accumulator (MAC) circuitry, for each of the plurality of second partitions, the convolution on channels of the circularly shifted plurality of channels that are in the corresponding second partition.

13. The method according to claim 12, comprising circularly shifting, by the shift circuitry, the plurality of channels arranged in the first order in one of a right direction or a left direction.

14. A device comprising:
a memory configured to store a plurality of data pieces of a current layer of a neural network, and
circuitry configured to:
store a plurality of channel identifiers associated with the plurality of data pieces of the current layer stored in the memory, the plurality of channel identifiers being arranged in a first order and partitioned into a plurality of first partitions according to the first order, wherein each first partition corresponds to a partition of channel identifiers associated with corresponding data pieces of a previous layer of the neural network, and is associated with a result of a convolution on the corresponding data pieces of the previous layer;
shift the plurality of channel identifiers arranged in the first order to a second order;
partition the shifted plurality of channel identifiers into a plurality of second partitions, according to the second order; and
for each of the plurality of second partitions, perform a convolution on data pieces associated with channel identifiers of the shifted plurality of channel identifiers that are in the corresponding second partition.

15. The device according to claim 14, wherein, wherein each of the plurality of channel identifiers arranged in the first order is associated with a corresponding data piece of the current layer.

16. The device according to claim 14, wherein, wherein each of the plurality of channel identifiers arranged in the second order is associated with a corresponding data piece of a layer of the neural network next to the current layer.

17. The device according to claim 14, wherein the circuitry is further configured to:
identify a memory address of a particular data piece associated with a corresponding channel identifier of the plurality of channel identifiers by applying an address mapping function to the corresponding channel identifier; and
read the particular data piece from the identified memory address in the memory.

* * * * *